(12) United States Patent
Uzoh

(10) Patent No.: US 10,957,661 B2
(45) Date of Patent: Mar. 23, 2021

(54) INTERCONNECTIONS FOR A SUBSTRATE ASSOCIATED WITH A BACKSIDE REVEAL

(71) Applicant: Invensas Corporation, San Jose, CA (US)

(72) Inventor: Cyprian Emeka Uzoh, San Jose, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

(21) Appl. No.: 16/528,354

(22) Filed: Jul. 31, 2019

(65) Prior Publication Data

US 2019/0355683 A1    Nov. 21, 2019

Related U.S. Application Data

(60) Continuation of application No. 15/830,745, filed on Dec. 4, 2017, now Pat. No. 10,418,338, which is a
(Continued)

(51) Int. Cl.
*H01L 23/48* (2006.01)
*H01L 23/00* (2006.01)
(Continued)

(52) U.S. Cl.
CPC ........ *H01L 24/02* (2013.01); *H01L 21/76898* (2013.01); *H01L 23/481* (2013.01);
(Continued)

(58) Field of Classification Search
CPC ............ H01L 21/02063; H01L 21/486; H01L 21/76804; H01L 21/76805; H01L 21/76813; H01L 21/76816; H01L 21/76831; H01L 21/76877; H01L 21/76879; H01L 21/76897; H01L 23/481; H01L 23/49827; H01L 23/5226; H01L 23/5384; H01L 29/4175; H01L 41/0474; H01L 2221/1026; H01L 2221/1031; H01L 2221/1036; H01L 2221/1057; H01L 2223/6616; H01L 2224/02372;
(Continued)

(56) References Cited

U.S. PATENT DOCUMENTS 6,184,081 B1   2/2001  Jeng et al.
7,271,482 B2   9/2007  Kirby
(Continued)

*Primary Examiner* — Cuong B Nguyen
*Assistant Examiner* — Samuel Park

(57) ABSTRACT

An apparatus relating generally to a substrate is disclosed. In this apparatus, a post extends from the substrate. The post includes a conductor member. An upper portion of the post extends above an upper surface of the substrate. An exterior surface of the post associated with the upper portion is in contact with a dielectric layer. The dielectric layer is disposed on the upper surface of the substrate and adjacent to the post to provide a dielectric collar for the post. An exterior surface of the dielectric collar is in contact with a conductor layer. The conductor layer is disposed adjacent to the dielectric collar to provide a metal collar for the post, where a top surface of each of the conductor member, the dielectric collar and the metal collar have formed thereon a bond structure for interconnection of the metal collar and the conductor member.

11 Claims, 18 Drawing Sheets

Related U.S. Application Data continuation of application No. 15/296,286, filed on Oct. 18, 2016, now Pat. No. 9,853,004, which is a division of application No. 14/050,215, filed on Oct. 9, 2013, now Pat. No. 9,484,325.

(51) Int. Cl.
*H01L 21/768* (2006.01)
*H01L 25/00* (2006.01)

(52) U.S. Cl.
CPC .............. *H01L 24/11* (2013.01); *H01L 24/13* (2013.01); *H01L 25/00* (2013.01); *H01L 2224/02166* (2013.01); *H01L 2224/02372* (2013.01); *H01L 2224/05548* (2013.01); *H01L 2224/11* (2013.01); *H01L 2224/11011* (2013.01); *H01L 2224/13024* (2013.01); *H01L 2224/13025* (2013.01); *H01L 2224/13101* (2013.01); *H01L 2224/13147* (2013.01); *H01L 2224/16145* (2013.01); *H01L 2224/16225* (2013.01); *H01L 2224/32225* (2013.01); *H01L 2224/73204* (2013.01); *H01L 2224/73253* (2013.01); *H01L 2924/15192* (2013.01); *H01L 2924/15311* (2013.01); *H01L 2924/16152* (2013.01); *Y10T 29/49165* (2015.01)

(58) Field of Classification Search
CPC . H01L 2224/05009; H01L 2224/05025; H01L 2224/05085; H01L 2224/05087; H01L 2224/0509; H01L 2224/05093; H01L 2224/0557; H01L 2224/08146; H01L 2224/08165; H01L 2224/08235; H01L 2224/13009; H01L 2224/13025; H01L 2224/16146; H01L 2224/16165; H01L 2224/16235; H01L 2224/29009; H01L 2224/29025; H01L 2224/32146; H01L 2224/32165; H01L 2224/8203; H01L 2225/06541; H01L 2225/06544; H01L 2225/06548; H01L 2225/107; H01L 2924/15172; H01L 2924/15182; H01L 2924/15192; H01L 2924/00014; H01L 21/76898; H01L 2924/14; H01L 2224/131; H01L 2224/48091; H01L 2924/014; H01L 2224/05552; H01L 2224/48227; H01L 2224/05647; H01L 2924/12042; H01L 2924/181; H01L 24/13; H01L 2924/00012; H01L 2224/0401; H01L 2224/13147; H01L 24/05; H01L 2224/05599; H01L 25/0657; H01L 2924/15311; H01L 2225/06513; H01L 25/50; H01L 2924/01078; H01L 2924/01029; H01L 24/11; H01L 2224/16145; H01L 24/03; H01L 24/16; H01L 24/48

See application file for complete search history.

(56) References Cited

U.S. PATENT DOCUMENTS

| | | | |
|---|---|---|---|
| 7,833,894 B2 | 11/2010 | Hiatt | |
| 8,836,142 B2 | 9/2014 | Park et al. | |
| 2004/0238927 A1* | 12/2004 | Miyazawa | H01L 25/0657 257/678 |
| 2005/0104228 A1* | 5/2005 | Rigg | H01L 25/0657 257/786 |
| 2006/0043599 A1* | 3/2006 | Akram | H01L 23/481 257/774 |
| 2006/0148250 A1* | 7/2006 | Kirby | H01L 25/50 438/667 |
| 2007/0045779 A1* | 3/2007 | Hiatt | H01L 21/76898 257/621 |
| 2007/0048994 A1* | 3/2007 | Tuttle | H01L 23/481 438/597 |
| 2007/0049016 A1* | 3/2007 | Hiatt | H01L 23/481 438/667 |
| 2008/0054444 A1* | 3/2008 | Tuttle | H01L 25/0657 257/698 |
| 2008/0136038 A1* | 6/2008 | Savastiouk | H01L 21/76898 257/774 |
| 2010/0170800 A1* | 7/2010 | Son | C01B 32/168 205/50 |
| 2012/0133021 A1* | 5/2012 | Joblot | H01L 23/481 257/532 |
| 2012/0261827 A1* | 10/2012 | Yu | H01L 21/3212 257/774 |
| 2014/0008815 A1 | 1/2014 | Park et al. | |

* cited by examiner

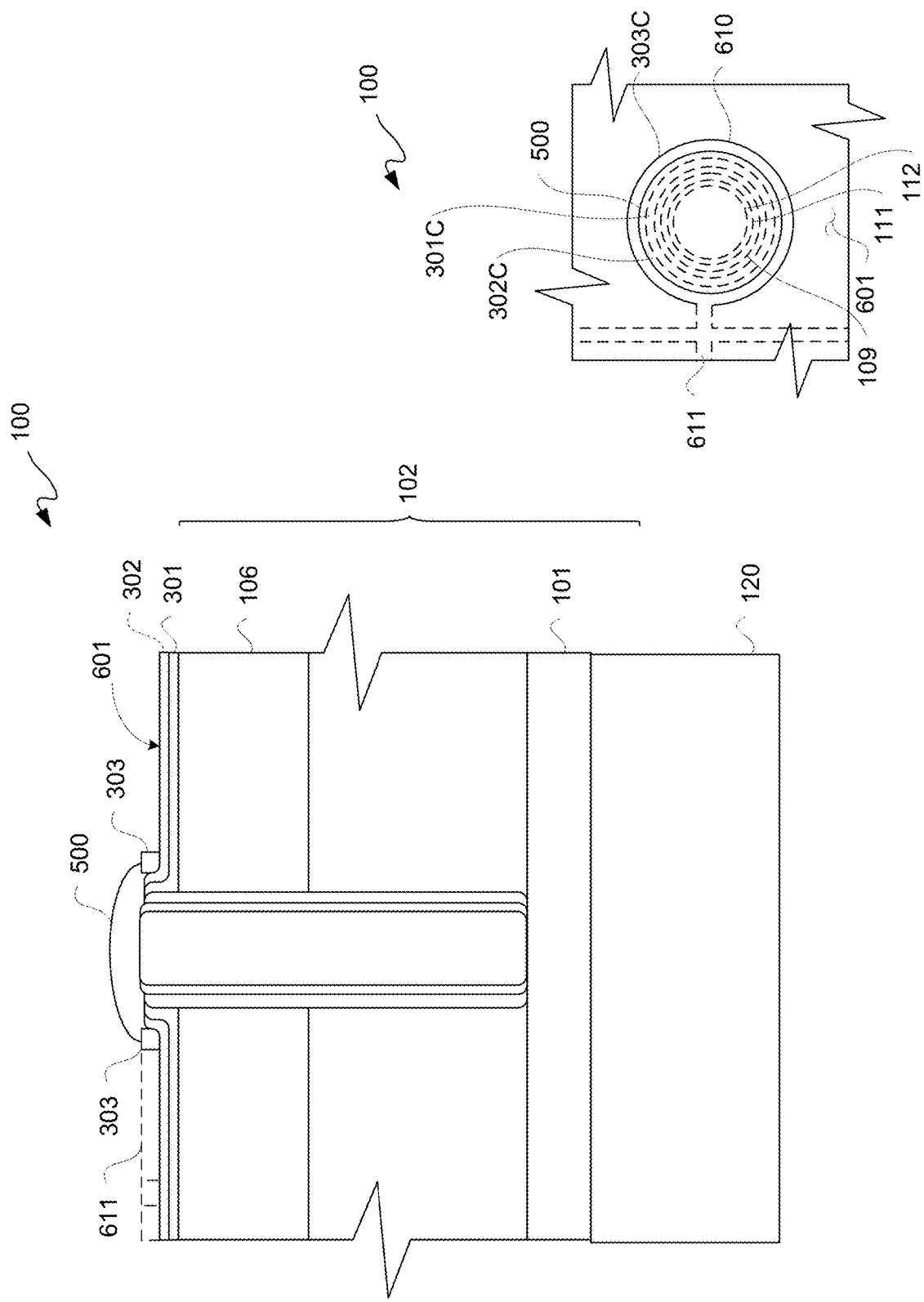

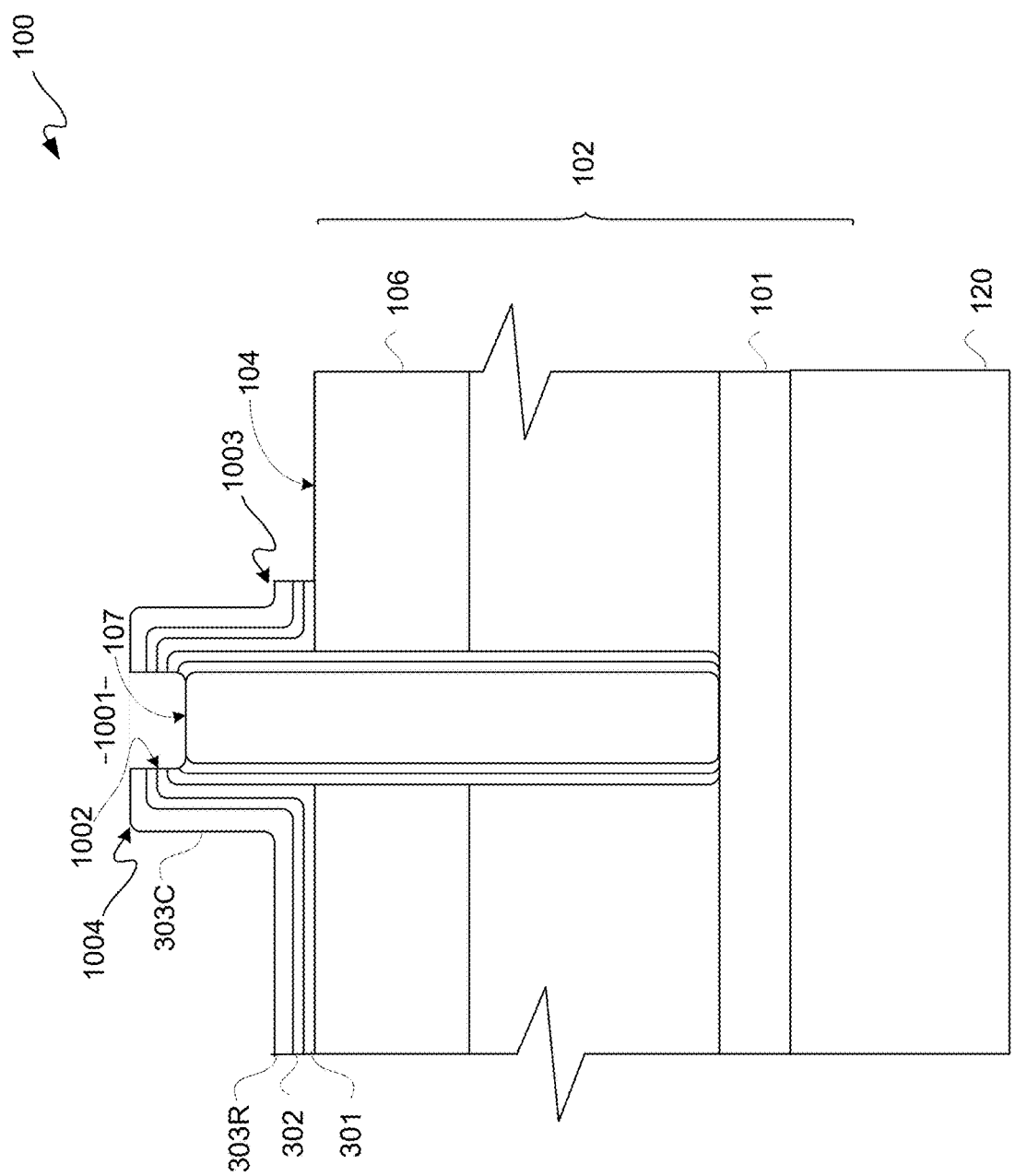

INTERCONNECTIONS FOR A SUBSTRATE ASSOCIATED WITH A BACKSIDE REVEAL

CROSS-REFERENCE TO RELATED APPLICATION

This application is a continuation of co-pending U.S. patent application Ser. No. 15/830,745, filed Dec. 4, 2017, which is a continuation of U.S. patent application Ser. No. 15/296,286, filed Oct. 18, 2016, now U.S. Pat. No. 9,853,004, issued Dec. 26, 2017, which is a divisional of U.S. patent application Ser. No. 14/050,215, filed Oct. 9, 2013, now U.S. Pat. No. 9,484,325, issued Nov. 1, 2016, the disclosures of each of which are incorporated herein by reference in their entirety.

FIELD OF THE INVENTION

The following description relates to integrated circuit devices ("ICs"). More particularly, the following description relates to interconnections for a substrate associated with a backside reveal.

BACKGROUND OF THE INVENTION

Microelectronic assemblies generally include one or more ICs, such as for example one or more packaged dies ("chips") or one or more dies. One or more of such ICs may be mounted on a circuit platform, such as a wafer such as in wafer-level-packaging ("WLP"), printed board ("PB"), a printed wiring board ("PWB"), a printed circuit board ("PCB"), a printed wiring assembly ("PWA"), a printed circuit assembly ("PCA"), a package substrate, an interposer, or a chip carrier. Additionally, one IC may be mounted on another IC. An interposer may be an IC, and an interposer may be a passive or an active IC, where the latter includes one or more active devices, such as transistors for example, and the former does not include any active device. Furthermore, an interposer may be formed like a PWB, namely without any circuit elements such as capacitors, resistors, or active devices. Additionally, an interposer includes at least one through-substrate-via.

An IC may include conductive elements, such as pathways, traces, tracks, vias, contacts, pads such as contact pads and bond pads, plugs, nodes, or terminals for example, that may be used for making electrical interconnections with a circuit platform. These arrangements may facilitate electrical connections used to provide functionality of ICs. An IC may be coupled to a circuit platform by bonding, such as bonding traces or terminals, for example, of such circuit platform to bond pads or exposed ends of pins or posts or the like of an IC. Additionally, a redistribution layer ("RDL") may be part of an IC to facilitate a flip-chip configuration, die stacking, or more convenient or accessible position of bond pads for example.

Conventionally, after an etch back for a backside reveal of through-silicon vias ("TSVs"), a conformal dielectric coating is deposited on the surfaces of the substrate and the revealed TSVs. This is followed by planarization to expose conductor vias of the TSVs and to planarize the backside. After which, a metal layer may be deposited for interconnection with the conductor vias. However, this conventional approach may have yield issues and/or cost issues, which make using it less desirable. Furthermore, this conventional approach may not be suitable for individual interconnections.

Accordingly, it would be desirable and useful to provide for post processing after a backside TSV reveal that improves yield, reduces cost, and/or increases versatility for individual interconnections.

SUMMARY OF THE INVENTION

An apparatus relates generally to a substrate. In such an apparatus, a post extends from the substrate. The post includes a conductor member. An upper portion of the post extends above an upper surface of the substrate. An exterior surface of the post associated with the upper portion is in contact with a dielectric layer. The dielectric layer is disposed on the upper surface of the substrate and adjacent to the post to provide a dielectric collar for the post. An exterior surface of the dielectric collar is in contact with a conductor layer. The conductor layer is disposed adjacent to the dielectric collar to provide a metal collar for the post, where a top surface of each of the conductor member, the dielectric collar and the metal collar have formed thereon a bond structure for interconnection of the metal collar and the conductor member.

A method relates generally to processing a substrate. In such a method, obtained is the substrate having a post extending therefrom. The post includes a conductor member. An upper portion of the post extends above an upper surface of the substrate. A dielectric layer is deposited over the upper surface of the substrate and the upper portion of the post. An exterior surface of the post associated with the upper portion is in contact with the dielectric layer. The dielectric layer is disposed on the upper surface of the substrate and adjacent to the post to provide a dielectric collar for the post. A conductor layer is deposited over the dielectric layer. An exterior surface of the dielectric collar is in contact with the conductor layer. The conductor layer is disposed adjacent to the dielectric collar to provide a metal collar for the post. A top surface of the conductive member is higher than a portion of the conductor layer. The substrate is polished to expose a top surface of the conductive member of the post. A bonding material is deposited onto the top surface of the conductive member and a top surface of each of the dielectric collar and the metal collar, where the top surface of each of the conductor member, the dielectric collar and the metal collar have formed thereon a bond structure for interconnection of the metal collar and the conductor member.

Another method relates generally to processing a substrate. In such a method, obtained is the substrate having a post extending therefrom. The post includes a conductor member. An upper portion of the post extends above an upper surface of the substrate. A dielectric layer is deposited over the upper surface of the substrate and the upper portion of the post. An exterior surface of the post associated with the upper portion is in contact with the dielectric layer. The dielectric layer is disposed on the upper surface of the substrate and adjacent to the post to provide a dielectric collar for the post. A conductor layer is deposited over the dielectric layer. An exterior surface of the dielectric collar is in contact with the conductor layer. The conductor layer is disposed adjacent to the dielectric collar to provide a metal collar for the post. A top surface of the conductive member is higher than a portion of the conductor layer. The conductor layer and the dielectric layer are etched to provide an opening and to expose the top surface of the conductor layer. A bonding material is deposited into the opening, onto the top surface of the conductive member, onto a top surface of the dielectric collar, and onto a top surface of the metal collar, where the top surface of each of the conductor member, the dielectric collar and the metal collar have formed thereon a bond structure for interconnection of the metal collar and the conductor member.

BRIEF DESCRIPTION OF THE DRAWINGS

Accompanying drawing(s) show exemplary embodiment(s) in accordance with one or more aspects of exemplary apparatus(es) and/or method(s). However, the accompanying drawings should not be taken to limit the scope of the claims, but are for explanation and understanding only.

FIG. 8A is a block diagram of a cross-sectional view depicting the exemplary substrate FIG. 7 after subsequent processing.

FIG. 8B is a block diagram of a top elevation view depicting the exemplary substrate of FIG. 7 after subsequent processing.

FIG. 12B is a block diagram of a cross-sectional view depicting the substrate of the in-process wafer of FIG. 9B after subsequent processing.

DETAILED DESCRIPTION OF THE DRAWINGS

In the following description, numerous specific details are set forth to provide a more thorough description of the specific examples described herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same number labels are used in different diagrams to refer to the same items; however, in alternative examples the items may be different.

Figure 1A:
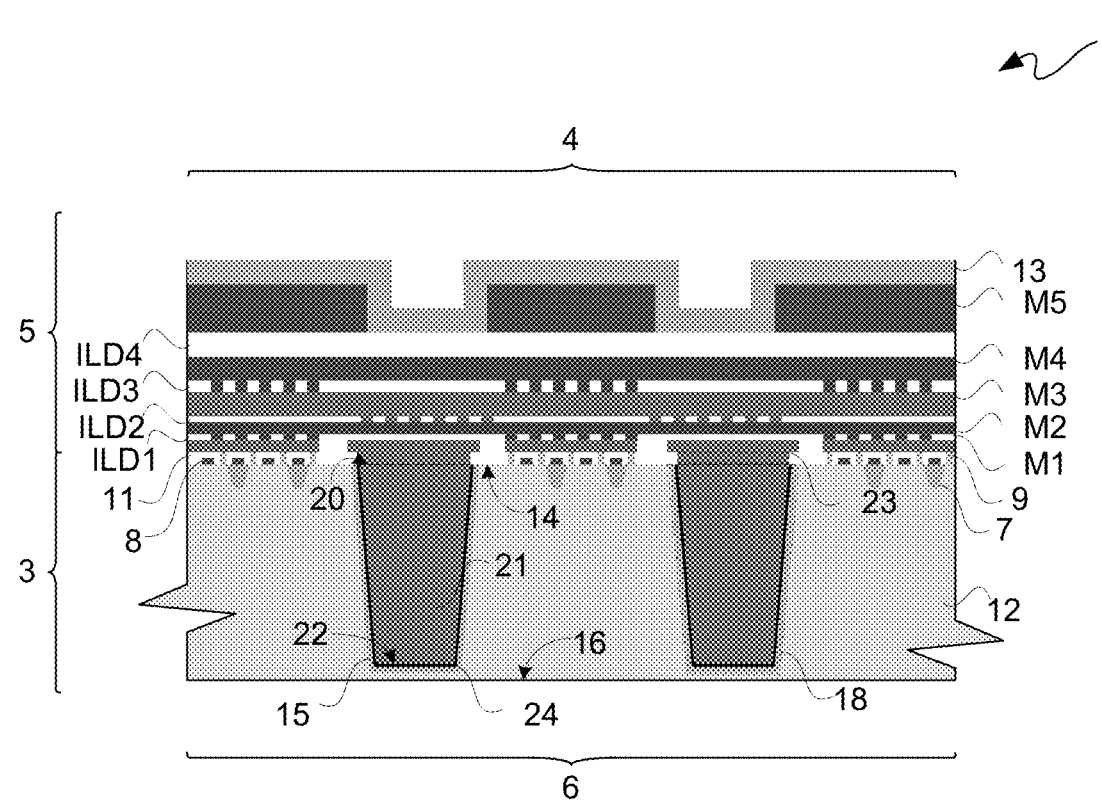
FIG. 1A is a schematic diagram of a cross-sectional view depicting an exemplary portion of an in-process wafer for providing an integrated circuit ("IC").

FIG. 1A is a schematic diagram of a cross-sectional view depicting an exemplary portion of an in-process wafer for providing an IC 10 component. IC 10 includes a substrate 12 of a semiconductor material such as silicon (Si), gallium arsenide (GaAs), polymeric, ceramic, carbon-based substrates such as diamond, a silicon carbon (SiC), germanium (Ge), $Si_{1-x}Ge_x$, or the like. Even though a semiconductor substrate 12 as provided from an in-process wafer is generally described below, any sheet or layer semiconductor material or dielectric material, such as ceramic or glass for example, may be used as a substrate. Furthermore, even though an IC 10 is described, any microelectronic component that includes one or more through-substrate via structures may be used.

Substrate 12 includes an upper surface 14 and a lower surface 16 that extend in lateral directions and are generally parallel to each other at a thickness of substrate 12. Use of terms such as "upper" and "lower" or other directional terms is made with respect to the reference frame of the figures and is not meant to be limiting with respect to potential alternative orientations, such as in further assemblies or as used in various systems.

Upper surface 14 may generally be associated with what is referred to as a "front side" 4 of an in-process wafer, and lower surface 16 may generally be associated with what is referred to as a "backside" 6 of an in-process wafer. Along those lines, a front-side 4 of an in-process wafer may be used for forming what is referred to as front-end-of-line ("FEOL") structures 3 and back-end-of-line ("BEOL") structures 5. Generally, FEOL structures 3 may include shallow trench isolations ("STI") 7, transistor gates 8, transistor source/drain regions (not shown), transistor gate dielectrics (not shown), contact etch stop layer ("CESL"; not shown), a pre-metallization dielectric or pre-metal dielectric ("PMD") 11, and contact plugs 9, among other FEOL structures. A PMD 11 may be composed of one or more layers. Generally, BEOL structures 5 may include one or more inter-level dielectrics ("ILDs") and one or more levels of metallization ("M"). In this example, there are four ILDs, namely ILD1, ILD2, ILD3, and ILD4; however, in other configurations there may be fewer or more ILDs. Furthermore, each ILD may be composed of one or more dielectric layers. In this example, there are five levels of metallization, namely M1, M2, M3, M4, and M5; however, in other configurations there may be fewer or more levels of metallization. Additionally, metal from a metallization level may extend through one or more ILDs, as is known. Furthermore, each level of metallization may be composed of one or more metal layers. A passivation level 13 may be formed on a last metallization layer. Such passivation level 13 may include one or more dielectric layers, and further may include an anti-reflective coating ("ARC"). Furthermore, a redistribution layer ("RDL") may be formed on such passivation level. Conventionally, an RDL may include: a dielectric layer, such as a polyimide layer for example; another metal layer on such dielectric layer and connected to a bond pad of a metal layer of a last metallization level; and another dielectric layer, such as another polyimide layer for example, over such RDL metal layer while leaving a portion thereof exposed to provide another bond pad. A terminal opening may expose such other bond pad of such RDL metal layer. Thereafter, a solder bump or wire bond may be conventionally coupled to such bond pad.

As part of a FEOL or BEOL structure formation, a plurality of via structures 18 may extend within openings formed in substrate 12 which extend into substrate 12. Via structures 18 may be generally in the form of any solid of any shape formed by filling an opening formed in substrate 12. Examples of such solid shapes generally include cylindrical, conical, frustoconical, rectangular prismatic, cubic, or the like. Examples of openings for via structures, vias, and processes for the fabrication thereof, may be found in U.S. patent application Ser. No. 13/193,814 filed Jul. 29, 2011, and U.S. patent application Ser. Nos. 12/842,717 and 12/842,651 both filed on Jul. 23, 2010, and each of these patent applications is hereby incorporated by reference herein for all purposes to the extent same is consistent with the description hereof.

Conventionally, via structures 18 may extend from upper surface 14 down toward lower surface 16, and after a backside reveal, via structures 18 may extend between surfaces 14 and 16, as effectively thickness of substrate 12 may be thinned so as to reveal lower end surfaces of via structures 18, as described below in additional detail. Via structures 18 extending through substrate 12 between surfaces 14 and 16, though they may extend above or below such surfaces, respectively, may be referred to as through-substrate-vias. As substrates are often formed of silicon, such through-substrate-vias are commonly referred to as TSVs, which stands for through-silicon-vias.

Such openings formed in substrate 12 may be conformally coated, oxidized, or otherwise lined with a liner or insulator 15. Conventionally, liner 15 is silicon dioxide; however, a silicon oxide, a silicon nitride, or another dielectric material may be used to electrically isolate via structures 18 from substrate 12. Generally, liner 15 is an insulating or dielectric material positioned between any and all conductive portions of a via structure 18 and substrate 12 such that an electronic signal, a ground, a supply voltage, or the like carried by such via structure 18 is not substantially leaked into substrate 12, which may cause signal loss or attenuation, shorting, or other circuit failure.

Overlying a liner 15 may be a barrier layer 24. Generally, barrier layer 24 is to provide a diffusion barrier with respect to a metallic material used to generally fill a remainder of an opening in which a via structure 18 is formed. Barrier layer 24 may be composed of one or more layers. Furthermore, a barrier layer 24 may provide a seed layer for subsequent electroplating or other deposition, and thus barrier layer 24 may be referred to as a barrier/seed layer. Moreover, barrier layer 24 may provide an adhesion layer for adherence of a subsequently deposited metal. Examples of materials that may be used for barrier layer 24 include tantalum (Ta), tantalum nitride (TaN), palladium (Pd), titanium nitride (TiN), TaSiN, compounds of Ta, compounds of Ti, compounds of Ni, compounds of Cu, among others.

Via structures 18 may generally consist of a metallic or other conductive material generally filling a remaining void in an opening formed in substrate 12 to provide a via conductor 21. In various examples, a via conductor 21 of a via structure 18 may generally consist of copper or a copper alloy. However, a via conductor 21 may additionally or alternatively include one or more other conductive materials such as tantalum, nickel, titanium, molybdenum, tungsten, aluminum, gold, or silver, including various alloys or compounds of one or more of the these materials, and the like. A via conductor 21 may include non-metallic additives to control various environmental or operational parameters of a via structure 18.

Via structures 18 may each include an upper end contact surface 20 which may be level with upper surface 14 of substrate 12 and a lower end contact surface 22 which may be level with lower surface 16 of substrate 12 after a backside reveal. End surfaces 20 and 22 may be used to interconnect via structures 18 with other internal or external components, as below described in additional detail.

In this example, upper end contact surface 20 of via conductors 21 are interconnected to M1 through a respective contact pad 23. Contact pads 23 may be formed in respective openings formed in PMD 11 in which M1 extends. However, in other configurations, one or more via conductors 21 may extend to one or more other higher levels of metallization through one or more ILDs. Furthermore, via structure 18 is what may be referred to as a front side TSV, as an opening used to form via structure is initially formed by etching from a front side of substrate 12.

Figure 1B:
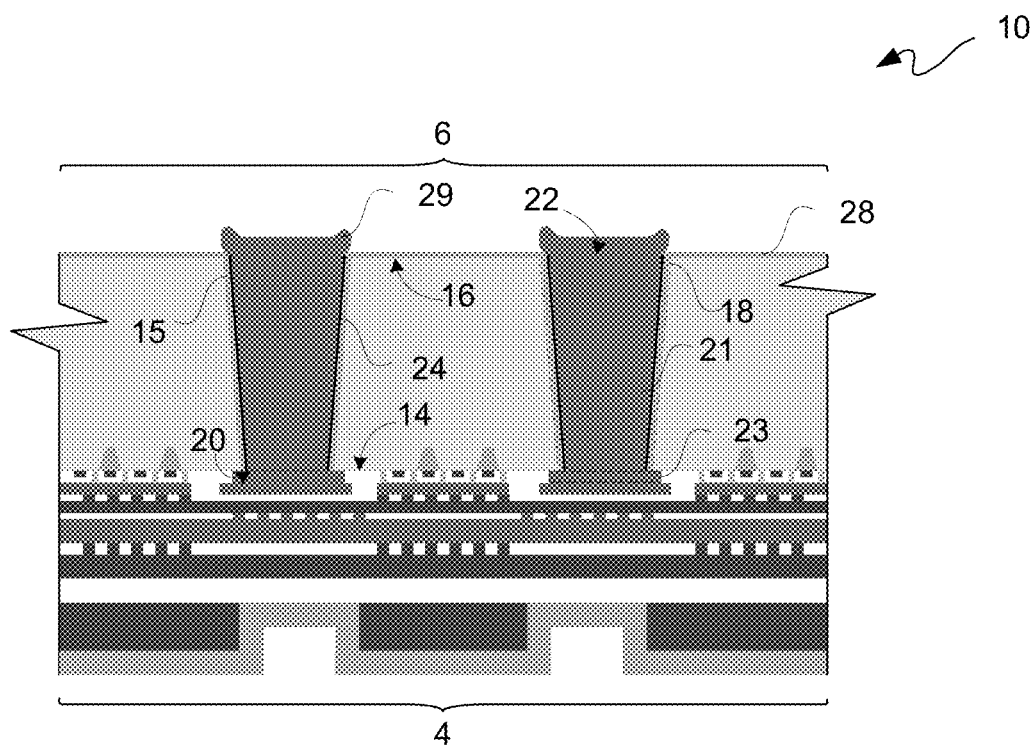
FIG. 1B is a schematic diagram of a cross-sectional view depicting an exemplary portion of an in-process wafer for providing another IC.

However, a via structure may be a backside TSV, as generally indicated in FIG. 1B, where there is shown a schematic diagram of a cross-sectional view depicting an exemplary portion of an in-process wafer for providing another IC 10. Fabrication of a backside TSV is generally referred to as a "via last approach," and accordingly fabrication of a front side TSV is generally referred to as a "via middle approach."

IC 10 of FIG. 1B includes a plurality of via structures 18, which are backside TSVs. For a backside TSV for via structure 18, liner 15 may be a deposited polymer into a "donut" silicon trench etch and deposited on lower surface 16 as a passivation layer 28, followed by a central silicon trench etch to remove an inner portion of the "donut" silicon trench, and followed by a seed layer deposition before patterning and electroplating to provide via conductors 21 having respective solder bump pads or landings 29. Optionally, a conventional anisotropic silicon etch may be used prior to depositing and patterning a polymer isolation layer as liner 15.

For purposes of clarity by way of example and not limitation, it shall be assumed that front side TSVs are used, as the following description is generally equally applicable to backside TSVs.

Figure 1C:
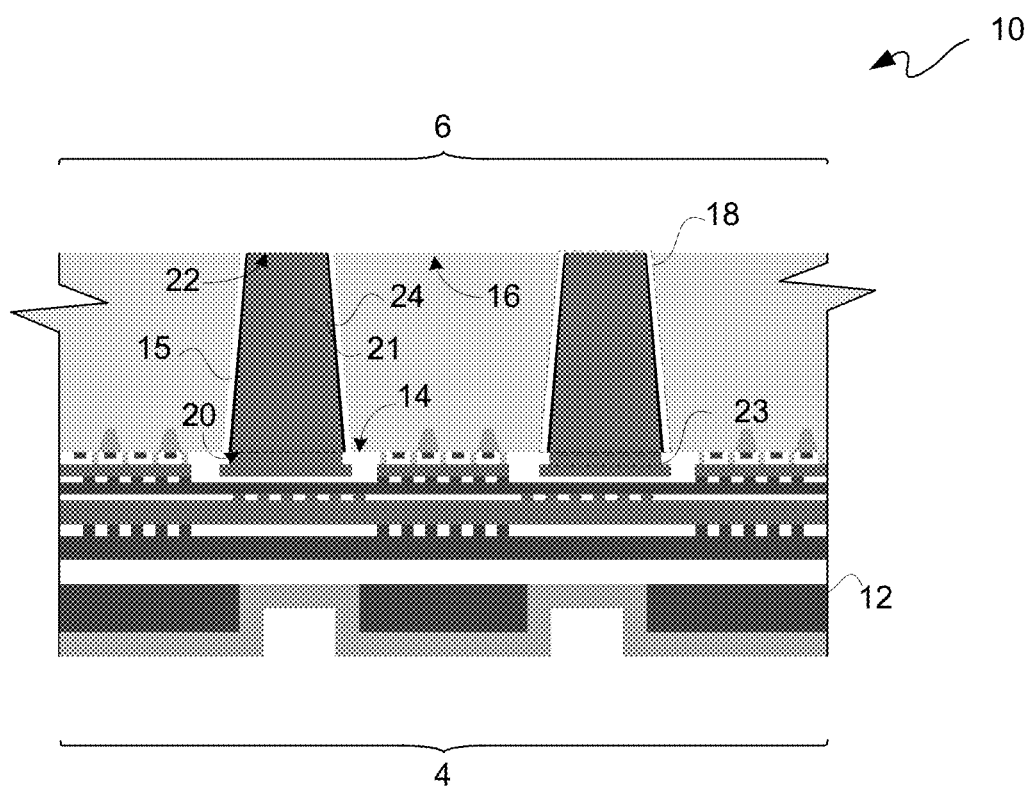
FIG. 1C is the diagram of FIG. 1A with the IC vertically flipped after chemical-mechanical-polishing of a lower surface of a substrate of the IC.

FIG. 1C is the diagram of FIG. 1A with IC 10 after a chemical-mechanical-polishing ("CMP") of a lower surface 16 of a substrate 12. Such CMP may be performed to temporarily reveal lower end contact surface 22, and thus portions of liner 15 and barrier layer 24 previously underlying lower end contact surface 22 may be removed by CMP. Thus, in this example, lower end contact surface 22 may be coplanar and level with lower surface 16.

Figure 1D:
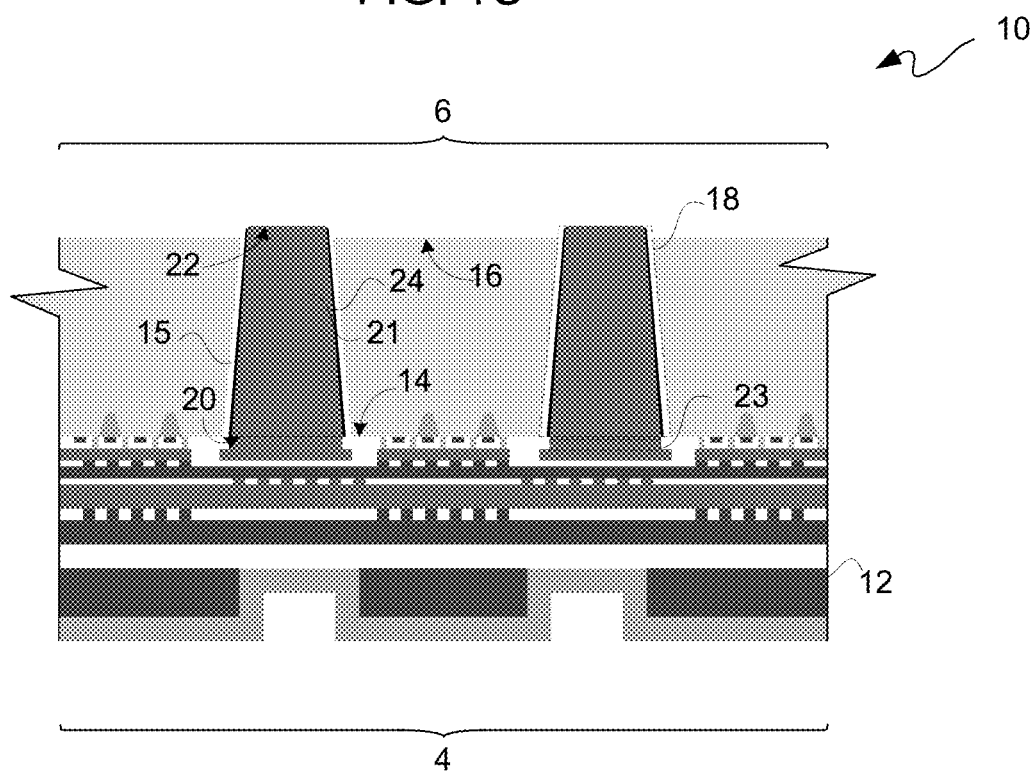
FIG. 1D is the diagram of FIG. 1A with the IC vertically flipped after a backside etch of a lower surface of a substrate of the IC to reveal a lower end contact surface of a via conductor thereof.

FIG. 1D is the diagram of FIG. 1A with IC 10 after a backside etch of a lower surface 16 of substrate 12 to temporarily reveal a lower end contact surface 22 of a via conductor 21. In this example, lower end contact surface 22 may be coplanar with lower surface 16; however, as via conductor 21, and optionally barrier layer 24, may protrude from substrate 12 after a backside reveal etch, lower end contact surface 22 in this example is not level with lower surface 16. For purposes of clarity and not limitation, IC 10 of FIG. 1D shall be further described, as the following description may likewise apply to IC 10 of FIG. 1C.

Figure 1E:
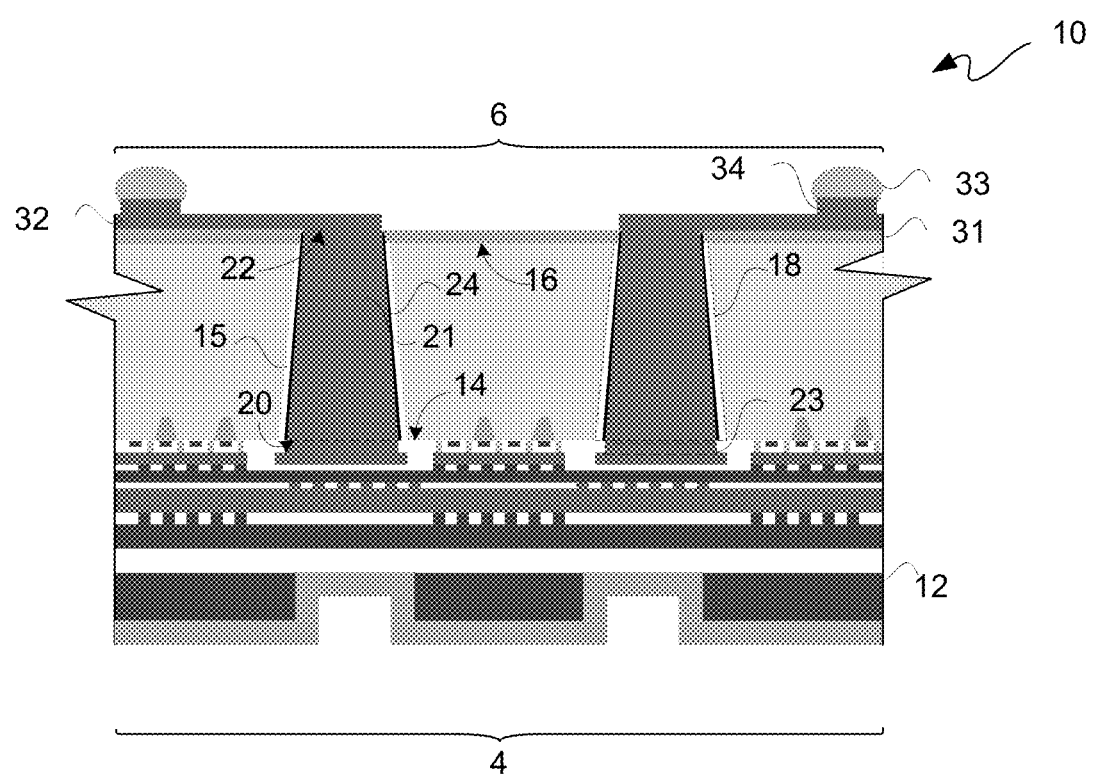
FIG. 1E is the diagram of FIG. 1D with a lower surface of the IC having formed thereon a passivation layer, which may be formed of one or more dielectric layers.

FIG. 1E is the diagram of FIG. 1D with a lower surface 16 of a substrate 12 having formed thereon a passivation layer 31, which may be formed of one or more dielectric layers. Furthermore, passivation layer 31 may be a polymer layer. For example, passivation layer 31 may be a benzocyclobutene ("BCB") layer or a combination of a silicon nitride layer and a BCB layer. In some applications, passivation layer 31 may be referred to as an inter-die layer. A metal layer 32, such as a copper, copper alloy, or other metal previously described, may be formed on passivation layer 31 and on lower end contact surfaces 22 of via conductors 21. This metal layer 32 may be an RDL metal layer. Balls 33 may be respectively formed on bonding pads 34, where such pads may be formed on or as part of metal layer 32. Balls 33 may be formed of a bonding material, such as solder or other bonding material. Balls 33 may be microbumps, C4 bumps, ball grid array ("BGA") balls, or some other die interconnect structure. In some applications, metal layer 32 may be referred to as a landing pad.

More recently, TSVs have been used to provide what is referred to as three-dimensional ("3D") ICs or "3D ICs." Generally, attaching one die to another using, in part, TSVs may be performed at a bond pad level or an on-chip electrical wiring level. ICs 10 may be diced from a wafer into single dies. Such single dies may be bonded to one another or bonded to a circuit platform, as previously described. For purposes of clarity by way of example and not limitation, it shall be assumed that an interposer is used for such circuit platform.

Interconnection components, such as interposers, may be in electronic assemblies for a variety of purposes, including facilitating interconnection between components with different connection configurations or to provide spacing between components in a microelectronic assembly, among others. Interposers may include a semiconductor layer, such as of silicon or the like, in the form of a sheet or layer of material or other substrate having conductive elements such as conductive vias extending within openings which extend through such layer of semiconductor material. Such conductive vias may be used for signal transmission through such interposer. In some interposers, ends of such vias may be used as contact pads for connection of such interposer to other microelectronics components. In other examples, one or more RDLs may be formed as part of such interposer on one or more sides thereof and connected with one or both ends of such vias. An RDL may include numerous conductive traces extending on or within one or more dielectric sheets or layers. Such traces may be provided in one level or in multiple levels throughout a single dielectric layer, separated by portions of dielectric material within such RDL. Vias may be included in an RDL to interconnect traces in different levels of such RDL.

Figure 2A:
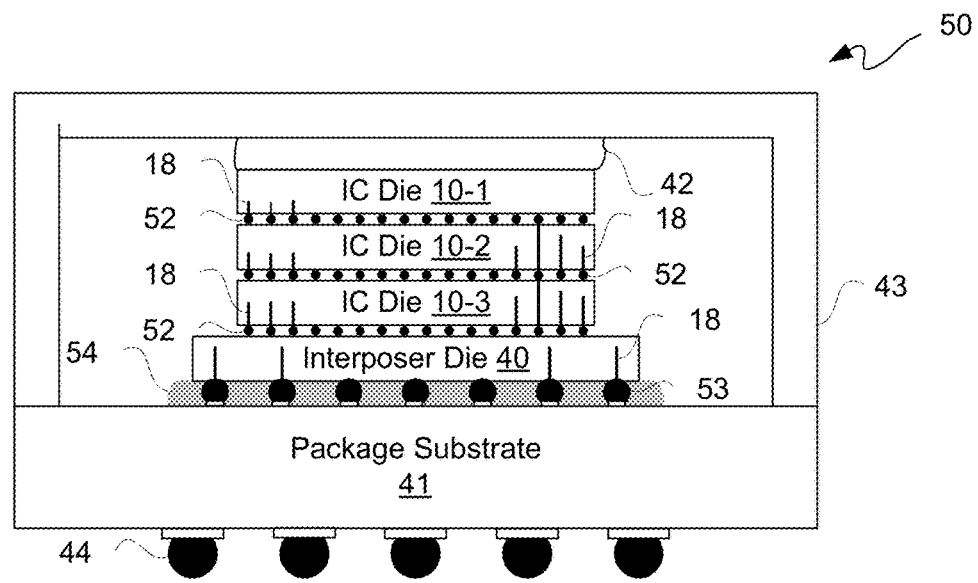
FIG. 2A is a block diagram of a cross-sectional view depicting an exemplary three-dimensional ("3D") IC packaged component with via structures.

FIG. 2A is a block diagram of a cross-sectional view depicting an exemplary 3D IC packaged component 50 with via structures 18. While a stacked die or a package-on-package die may include TSV interconnects, use of via structures 18 for a 3D IC packaged component 50 is described for purposes of clarity by way of example. In this example of a 3D IC packaged component 50, there are three ICs 10, namely ICs 10-1, 10-2, and 10-3, stacked one upon the other. In other implementations, there may be fewer or more than three ICs 10 in a stack. ICs 10 may be bonded to one another using microbumps 52 or flip-chip solder bumps. Optionally, Cu pillars extending from a backside of a die may be used. Some of these microbumps 52 may be interconnected to via structures 18. For example, a Cu/Sn microbump transient liquid phase ("TLP") bonding technology may be used for bonding ICs to one another. Thus, interconnect layers may be on one upper or lower side or both upper and lower sides of an IC 10 of a 3D stack.

A bottom IC 10-3 of such ICs in a 3D stack optionally may be coupled to an interposer 40. Interposer 40 may be an active die or a passive die. For purposes of clarity and not limitation, it shall be assumed that interposer 40 is a passive die. IC 10-3 may be coupled to interposer 40 by microbumps 52. Interposer 40 may be coupled to a package substrate. A package substrate may be formed of thin layers called laminates or laminate substrates. Laminates may be organic or inorganic. Examples of materials for "rigid" package substrates include an epoxy-based laminate such as FR4, a resin-based laminate such as bismaleimide-triazine ("BT"), a ceramic substrate, a glass substrate, or other form of package substrate. An under fill 53 for a flip chip attachment may encapsulate C4 bumps or other solder balls 53 used to couple interposer die 40 and package substrate 41. A spreader/heat sink ("heat sink") 42 may be attached to package substrate 41, and such heat sink 42 and substrate package 41 in combination may encase ICs 10 and interposer 40 of such 3D stack. A thermal paste 42 may couple an upper surface of IC 10-1 on top of such 3D stack to an upper internal surface of such heat sink 42. Ball grid array ("BGA") balls or other array interconnects 44 may be used to couple package substrate 41 to a circuit platform, such as a PCB for example.

Figure 2B:
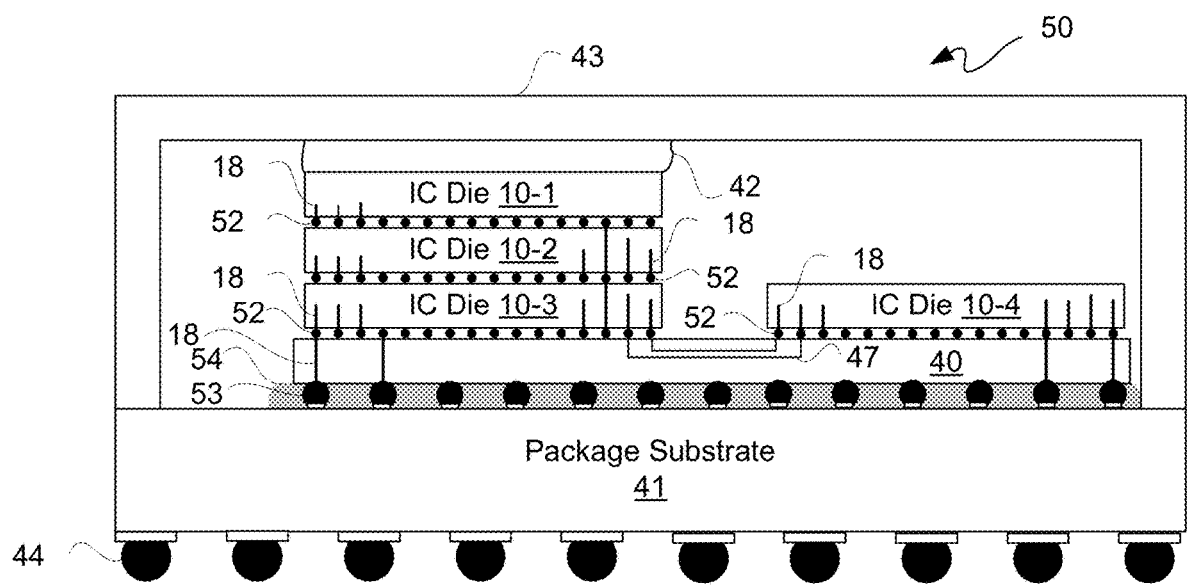
FIG. 2B is a block diagram of a cross-sectional view depicting another exemplary 3D IC packaged component with via structures.

FIG. 2B is a block diagram of a cross-sectional view depicting another exemplary 3D IC packaged component 50 with via structures 18. 3D IC packaged components 50 of FIGS. 2A and 2B are the same except for the following differences; in FIG. 2B, another IC 10-4 is separately coupled via microbumps 52 to interposer 40, where IC 10-4 is not coupled in the stack of ICs 10-1, 10-2, and 10-3. Furthermore, interposer 40 includes metal and via layers for providing wires 47 for interconnecting ICs 10-3 and 10-4. Furthermore, interposer 40 includes via structures 18 coupled to IC 10-4 through microbumps 52.

3D wafer-level packaging ("3D-WLP") may be used for interconnecting two or more ICs, one or more ICs to an interposer, or any combination thereof, where interconnects thereof may use via structures 18. Optionally, ICs may be interconnected die-to-die ("D2D") or chip-to-chip ("C2C"), where interconnects thereof may use via structures 18. Further, optionally, ICs may be interconnected die-to-wafer ("D2W") or chip-to-wafer ("C2W"), where interconnects thereof may use via structures 18. Accordingly, any of a variety of die stacking or chip stacking approaches may be used to provide a 3D stacked IC ("3D-SIC" or "3D-IC").

Figure 3:
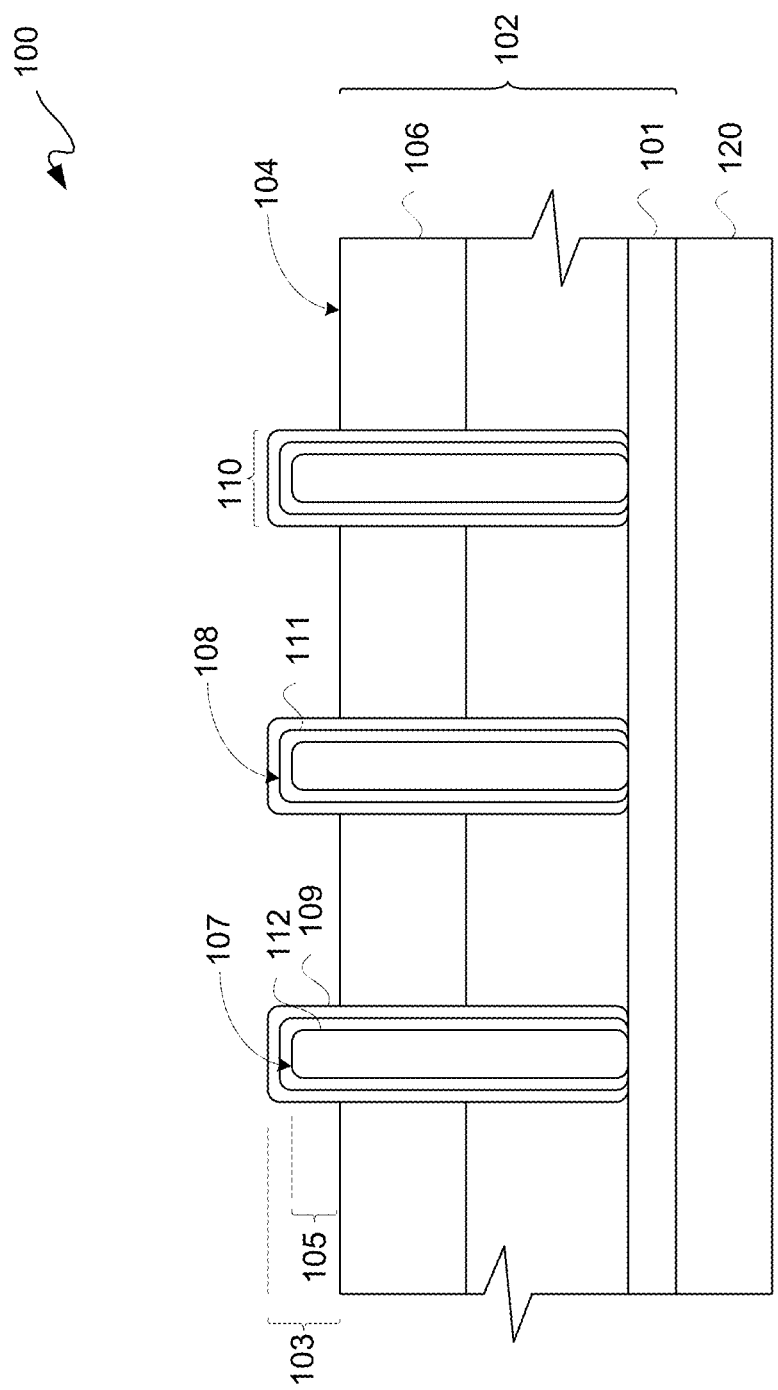
FIG. 3 is a block diagram of a cross-sectional view depicting an exemplary substrate of an in-process wafer.

FIG. 3 is a block diagram of a cross-sectional view depicting an exemplary substrate 100 of an in-process wafer. Substrate 100 includes a redistribution layer ("RDL") or a back-end-of-line ("BEOL") layer ("metal layer") 101 interconnected to a plurality of vias 110 of a substrate assembly 102. Substrate assembly 102 may be attached to a support platform 120. Such attachment of support platform 120 is conventionally with an adhesive, so as to be able to remove support platform 120 later in the processing of a wafer. Accordingly, it should be understood that upper or top surface 104 of a substrate layer 106 is an upper surface for a backside metal post reveal, and thus upper surface 104 may optionally be thought of as a lower or bottom surface. However, for purposes of clarity and not limitation, surface 104 shall be referred to as an upper surface hereinbelow.

For substrate assembly 102 having a silicon substrate layer 106, vias 110 may be through-silicon-vias ("TSVs"). However, another type of semiconductor or a dielectric material may be used for substrate layer 106 in other implementations. Thus, substrate layer 106 may, though need not, be a portion of a slice or a slice of a single crystal of silicon as is common. Furthermore, vias 110 need not be through substrate vias, but may be posts located in and revealed to extend out of a substrate layer 106. Thus, for purposes of clarity and not limitation vias 110 are referred to as posts. Along those lines, an upper or backside portion of substrate layer 106 may be removed, such as by a backside etch for example, to reveal or expose upper or bottom portions of posts 110. Again, for purposes of clarity and not limitation portions 105 of posts 110 shall be referred to as upper or top portions.

Furthermore for purposes of clarity and not limitation, multiple layers between substrate layer 106 and metal layer 101 are not shown. However, it should be understood that substrate 100 may be an active die or a passive die for example. With respect to the latter, substrate 100 may be a passive interposer.

Each post 110 includes a conductor member 112 and may optionally include either or both liner layer 109 and barrier and/or adhesion ("barrier/adhesion") layer 111. Conventionally, a liner layer 109 is formed or deposited to line an inner surface of a hole followed by deposition of a barrier/adhesion layer 111, which is then followed by deposition of a metal layer to provide conductor member 112. Upper portions 103 of posts 110, which include upper portions 105, may include barrier/adhesion layer 111 disposed on a top surface 107 of conductive member 112, as well as a sidewall of conductive member 112, along with a liner layer 109 disposed on such portion of barrier/adhesion layer 111 associated with upper portions 105. A conductive member 112 portion associated with upper portion 105, as well as a barrier/adhesion layer 111 portion and a liner layer 109 portion associated with upper portion 103, may extend above or from an upper surface 104 of substrate layer 106. For purposes of clarity and not limitation, a "via middle" formation is assumed in contrast to a "via last" formation. However, it will be appreciated from the following description that either or both a "via last" and a "middle first" and via first formation may be used.

Figure 4B:
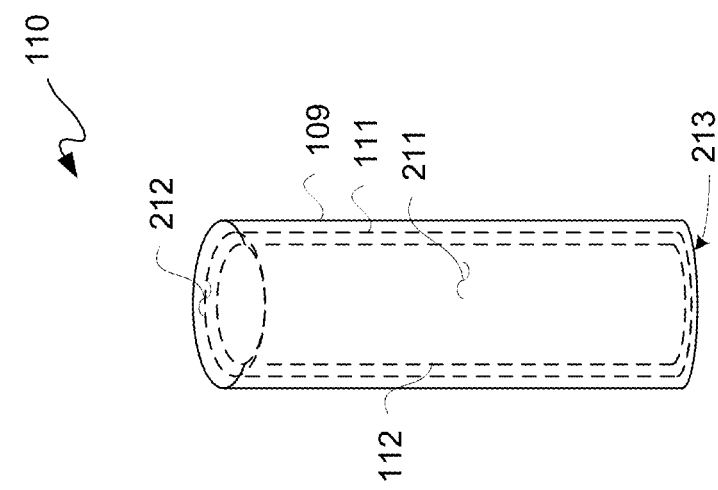
FIG. 4B is a perspective view depicting an exemplary post.
Figure 4A:
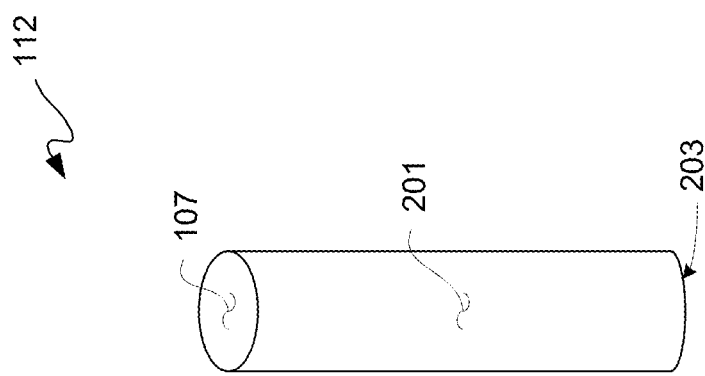
FIG. 4A is a perspective view depicting an exemplary conductive member.

FIG. 4A is a perspective view depicting an exemplary conductive member 112. Conductive member 112 may have a circular, elliptical, oval, square with rounded corners, rectangular with rounded corners, or other geometric shape. For purposes of clarity and not limitation, conductive member 112 is illustratively depicted as a cylindrical member with a circular top surface 107. Conductive member 112 may be imaged as a square but printed as a square with rounded corners to the point of appearing as a circle. Even though sidewall surface 201 of conductive member 112 is illustratively depicted as being uniform, such sidewall surface 201 may have roughness and may taper. Along those lines, bottom surface 203 may have a larger cross-sectional area than top surface 107, as an etched hole or holes ("hole") used to form a conductive member 112 may be etched right-side up in reverse of the depiction in FIG. 4A.

FIG. 4B is a perspective view depicting an exemplary post 110. After forming a hole for formation of post 110, one or more liner and barrier/adhesion layers, generally liner layer 109 and barrier/adhesion layer 111, may be deposited to line such hole. In some applications, the liner 109 may be irrelevant and omitted between substrate 106 and conductor 110. With simultaneous reference to FIGS. 3, 5A, and 5B, post 110 is further described. Such lined hole in substrate assembly 102 of FIG. 3 may thus be filled with a conductive material ("a metal layer") in order to provide conductive member 112. For a via last formation, conductive member 112 may line but not fill such etched holes. However, a middle first formation is assumed for purposes of clarity by way of example and not limitation. Along those lines, liner layer 109, as well as barrier/adhesion layer 111, may have a respective top surface 212 located above top surface 107 and a respective sidewall surface 211 located outwardly from sidewall surface 201. Bottom surface 213, which is a top surface when post 110 is initially formed, of both liner layer 109 and barrier/adhesion layer 111 may be co-planar with bottom surface 203 after completing front-side processing of post 110.

Figure 5B:
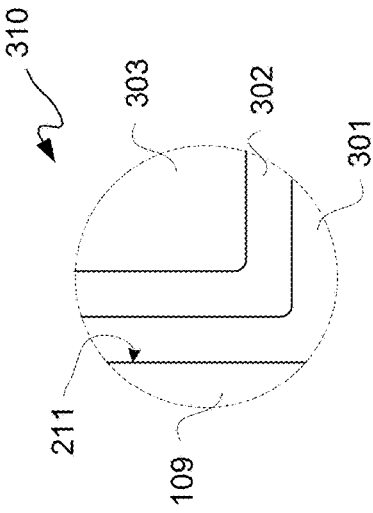
FIGS. 5B and 5C are respective enlarged views of a portion of the substrate of FIG. 5A.
Figure 5C:
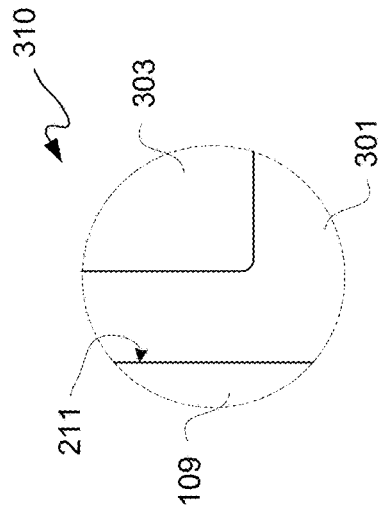
Figure 5A:
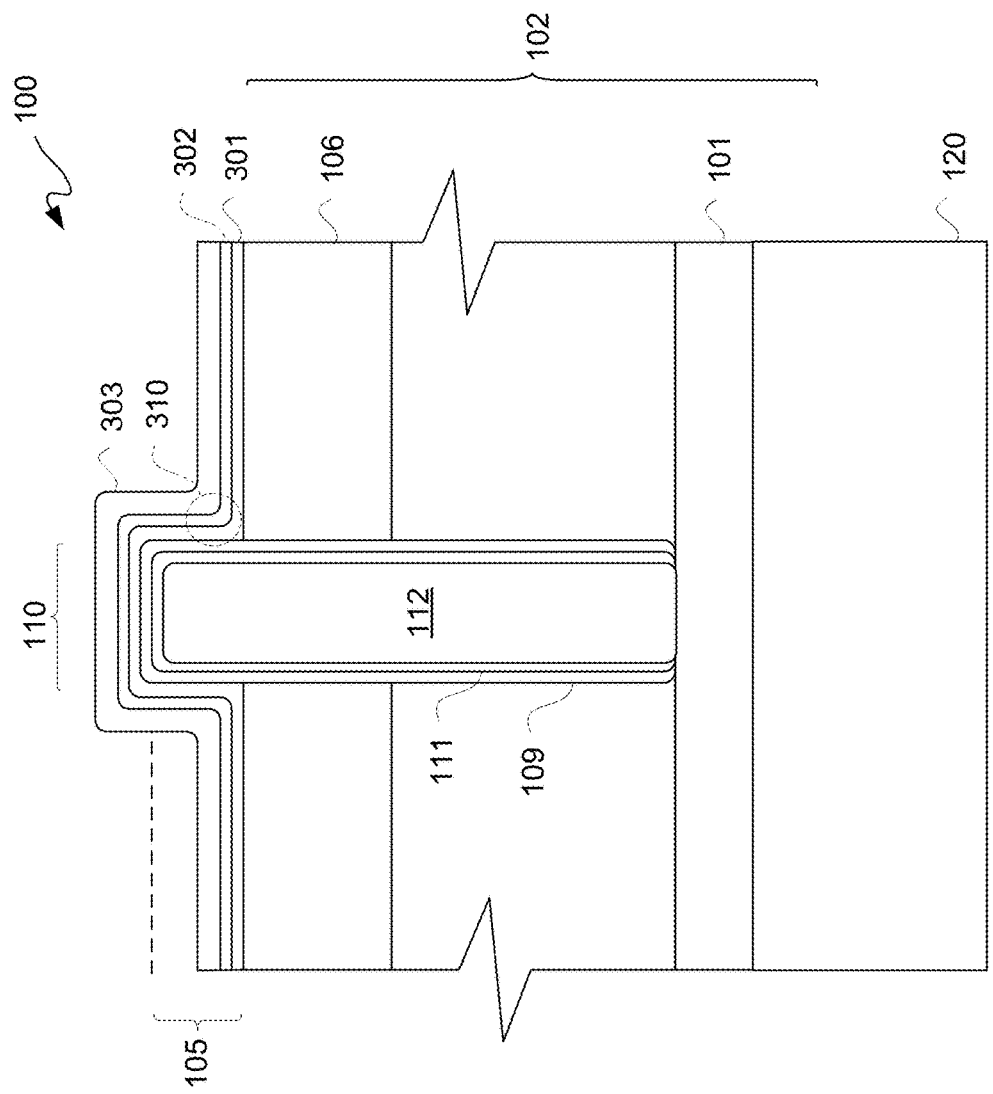
FIG. 5A is a block diagram of a cross-sectional view depicting a portion of the exemplary substrate of the in-process wafer of FIG. 3 after subsequent processing.

FIG. 5A is a block diagram of a cross-sectional view depicting a portion of the exemplary substrate 100 of the in-process wafer of FIG. 3 after subsequent processing. In FIG. 5A, only a single post 110 is illustratively depicted for purposes of clarity. However, it should be understood that substrate assembly 102 may have multiple posts 110.

FIG. 5B is an enlarged view of a portion 310 of substrate 100 of FIG. 5A. With simultaneous reference to FIGS. 3, 4A, 4B, 5A, and 5B, formation of substrate 100 is further described.

A dielectric coating or layer 301 may be conformally or non-conformally deposited onto top surface 104 of substrate layer 106, as well as an exterior surface of liner layer 109 to provide a dielectric layer for a collar. Optionally, an exposed portion of liner layer 109, as well as a portion of barrier/adhesion layer 111 underlying such portion of liner layer 109, namely as associated with upper portion 103, may be removed prior to deposition of dielectric layer 301, and thus upper portion 105 may be exposed for having dielectric layer 301 directly deposited thereon. In other implementations, liner layer 109 may be omitted, and so a barrier/adhesion layer 111 may be sufficient. In other implementations, liner layer 109 and barrier/adhesion layer 111 materials may be similar materials, and in other implementations, there may be no barrier/adhesion layer 111. Thus, dielectric layer 301 may provide a liner and/or barrier/adhesion layer or at least a level of a barrier. However, for purposes of clarity by way of example and not limitation, it shall be assumed that liner layer 109 and barrier/adhesion layer 111 as associated with upper portion 103 of FIG. 3 are left in place when dielectric layer 301 is deposited. Thus, dielectric layer 301 may abut or otherwise be in contact with an exposed portion of sidewall surface 211 of liner layer 109 as associated with upper portion 103. As described below in additional detail, a portion of dielectric layer 301 abutting such sidewall surface 211 of liner layer 109 may provide a dielectric collar for post 110. Optionally, a high pressure plasma chemical vapor deposition ("CVD") may be used to have a thin sidewall or vertical surface deposition with respect to horizontal surface deposition of a dielectric layer 301 for such non-conformal deposition.

Optionally, another dielectric coating or layer 302 may be conformally or non-conformally deposited onto a top surface of dielectric layer 301 to provide a dielectric layer stack. More generally, one or more dielectric layers may be conformally or non-conformally deposited onto a metal post revealed backside of a substrate assembly 102 to provide a dielectric collar for post 110. For example, dielectric layer 301 may be a thin dielectric layer of a silicon oxide or a silicon nitride, and dielectric layer 302 may be substantially thicker than dielectric layer 301 and may be formed of a polymer, such as a polyimide for example. However, in other implementations, dielectric layers 301 and 302 may be similar or the same material. For purposes of clarity and not limitation, it shall be assumed that dielectric layers 301 and 302 are both present and are both conformally or non-conformally deposited.

A conductor ("metal") layer 303 may be conformally or otherwise deposited onto dielectric layer 302. Along those lines, a portion of metal layer 303 is located below a top surface of 107 of conductive member 112. In other words, a portion of metal layer 303 is located below upper portion 105. In another implementation, metal layer 303 may include one of one or more metal layers. Thus, while generally conformal depositions of dielectric and metal layers have been described for purposes of clarity, as long as a portion of metal layer 303 is below upper portion 105, depositions other than or in addition to one or more conformal or non-conformal depositions may be used. Furthermore, an exterior surface of dielectric layer 302, or dielectric layer 301 if dielectric layer 302 is not used, may be in contact with an interior surface of metal layer 303 as associated with and spaced apart from a sidewall surface portion of post 110. As described below in additional detail, a portion of metal layer 303 may thus provide a collar around or about a dielectric collar or dielectric collars. Such metal collar may be used as a solder scavenger collar for post 110.

Again, liner layer 109 may for example be a silicon oxide or a silicon nitride. Barrier/adhesion layer 111 may be Ta, TaN, or other suitable barrier/adhesion layer as may depend upon the material used for conductive member 112. Conductive member 112 may be Cu, Al, W, or other metal or a metal compound. Dielectric layers 301 and 302 may be a silicon oxide, a silicon nitride, a polymer such as polyimide, or BCB for example. Metal layer 303 may be Cu, Al, W, or other metal or a metal compound. These are just some examples of materials that may be used, and in other implementations, these and/or other materials may be used. Dielectric layers 301 and 302 may be the same or different materials. Along those lines, FIG. 5C is FIG. 5B though without dielectric layer 302. Accordingly, dielectric layer 301 may be a polyimide with an adhesion promoter or BCB for example.

Figure 6:
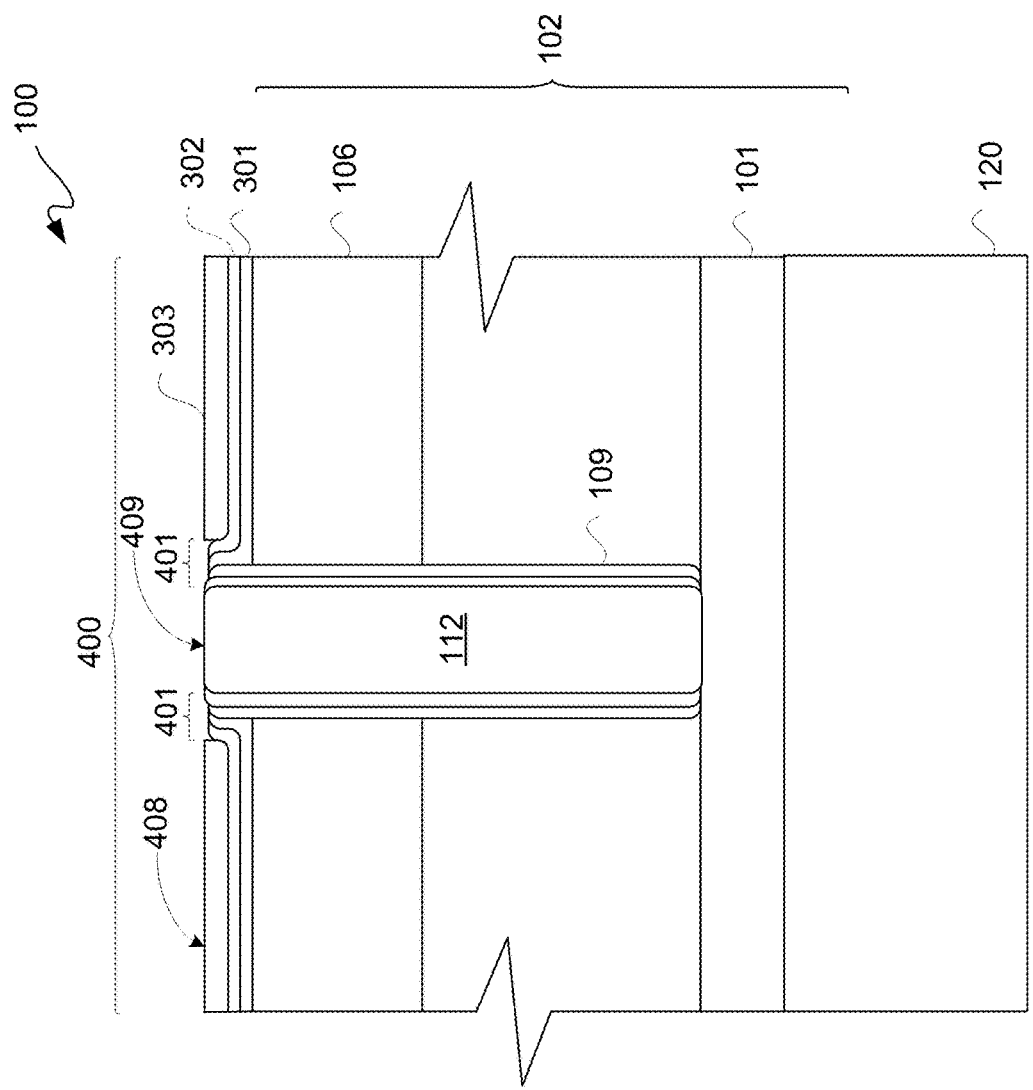
FIG. 6 is a block diagram of a cross-sectional view depicting a portion of the exemplary substrate of the in-process wafer of FIG. 5A after subsequent processing.

FIG. 6 is a block diagram of a cross-sectional view depicting a portion of the exemplary die 100 of the in-process wafer of FIG. 5A after subsequent processing. A top portion of in-process substrate 100 is removed such as by chemical-mechanical-polishing ("CMP") to provide a generally planar surface 400. There may be some eroding around post 110 of dielectric layers 301 and 302, as well as barrier/adhesion layer 111, as generally indicated as eroded out area 401. However, in other implementations, there may be little to no eroding. Thus, eroding may or may not be present. After CMP, a top surface 408 of metal layer 303 may be co-planar with a top surface 409 of conductive member 112. Recall, that an upper portion 105 of conductive member 112 was disposed above a portion of metal layer 303. Along those lines, after CMP, a portion of metal layer 303 may remain after polishing down an uppermost part of conductive member 112. In another implementation, metal layer 303 may patterned and processed for a distribution layer. Such an etched patterned metal layer 303 may be coated with a dielectric layer (not shown) prior to a CMP operation.

Figure 7:
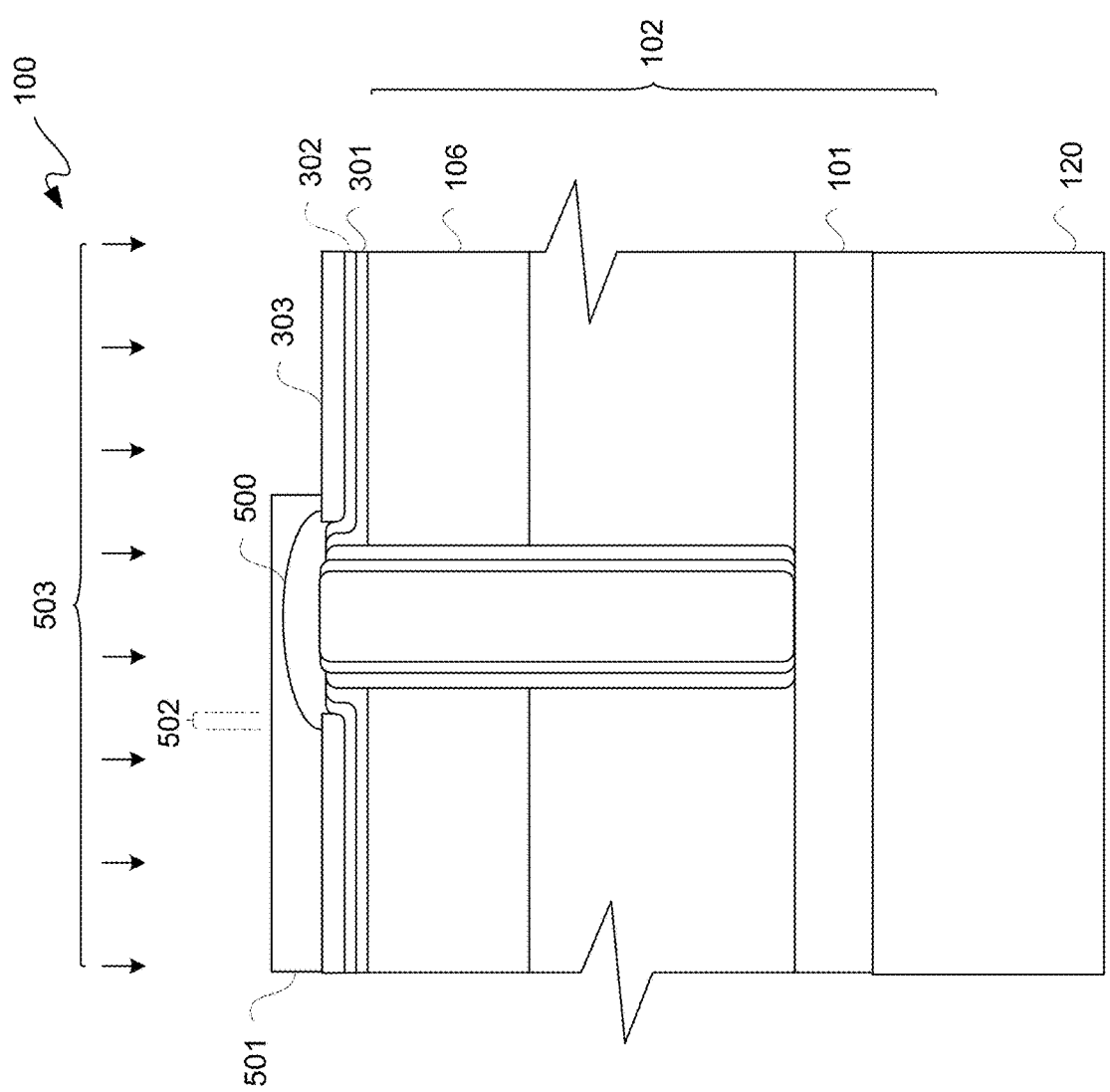
FIG. 7 is a block diagram of a cross-sectional view depicting the exemplary substrate of FIG. 6 after subsequent processing.

FIG. 7 is a block diagram of a cross-sectional view depicting the exemplary substrate 100 of the in-process wafer of FIG. 6 after subsequent processing. With simultaneous reference to FIGS. 3, 4A, 4B, 5A, 5B, 6, and 7, formation of substrate 100 is further described.

A bonding material, such as solder, is deposited on a top surface 409 of conductor member 112 to provide a bond structure 500. Metal layer 303 may act as a seed layer for selective adherence of such bonding material. Such bonding material may fill eroded out area 401, as well as overlap 502 onto a collar portion of metal layer 303. Accordingly, a top surface 409 of conductor member 112 and a solder scavenger collar has formed thereon a bond structure 500 for interconnection of conductor member 112 and a metal collar formed of metal layer 303. Metal layer 303 may further be for an RDL. A resist layer 501 may be deposited and patterned to protect a collar portion of metal layer 303, as well as protect bond structure 500 and an RDL interconnect portion of metal layer 303. Accordingly, an RDL may be patterned using resist layer 501. After masking with resist layer 501, an anisotropic or isotropic metal etch 503 may be used to remove a portion of unwanted metal layer 303.

FIG. 8A is a block diagram of a cross-sectional view depicting the exemplary substrate 100 of the in-process wafer of FIG. 7 after subsequent processing. FIG. 8B is a block diagram of a top elevation view depicting substrate 100 of the in-process wafer of FIG. 7 after subsequent processing. With simultaneous reference to FIGS. 3, 4A, 4B, 5A, 5B, 6, 7, 8A, and 8B formation of substrate 100 is further described.

After etch 503, resist layer 501 may be removed. One or more traces or strips 611 of metal layer 303 may be part of an RDL, and a metal collar 303C of metal layer 303, which may be used to scavenge solder, may encircle, or more generally at least partially surround, post 110. Thus, a same mask used to form metal collar 303C may be used in the formation of an RDL. After etching with etch 503, a portion of a top surface 601 of dielectric layer 302 may be exposed. Dielectric layers 302 and 301, as well as barrier/adhesion layer 111 and conductive member 112, may be disposed under bond structure 500, and dielectric layers 302 and 301 may provide concentric dielectric collars 302C and 301C, respectively, within such a metal collar 303C. Thus, bond structure 500 may be used to interconnect an RDL of substrate 100 to a conductive member 112 of a post 110 of such substrate 100. A polymer layer (not shown in this figure) may be deposited as a sold mask, where bond structure 500 extends above such sold mask.

Figure 9A:
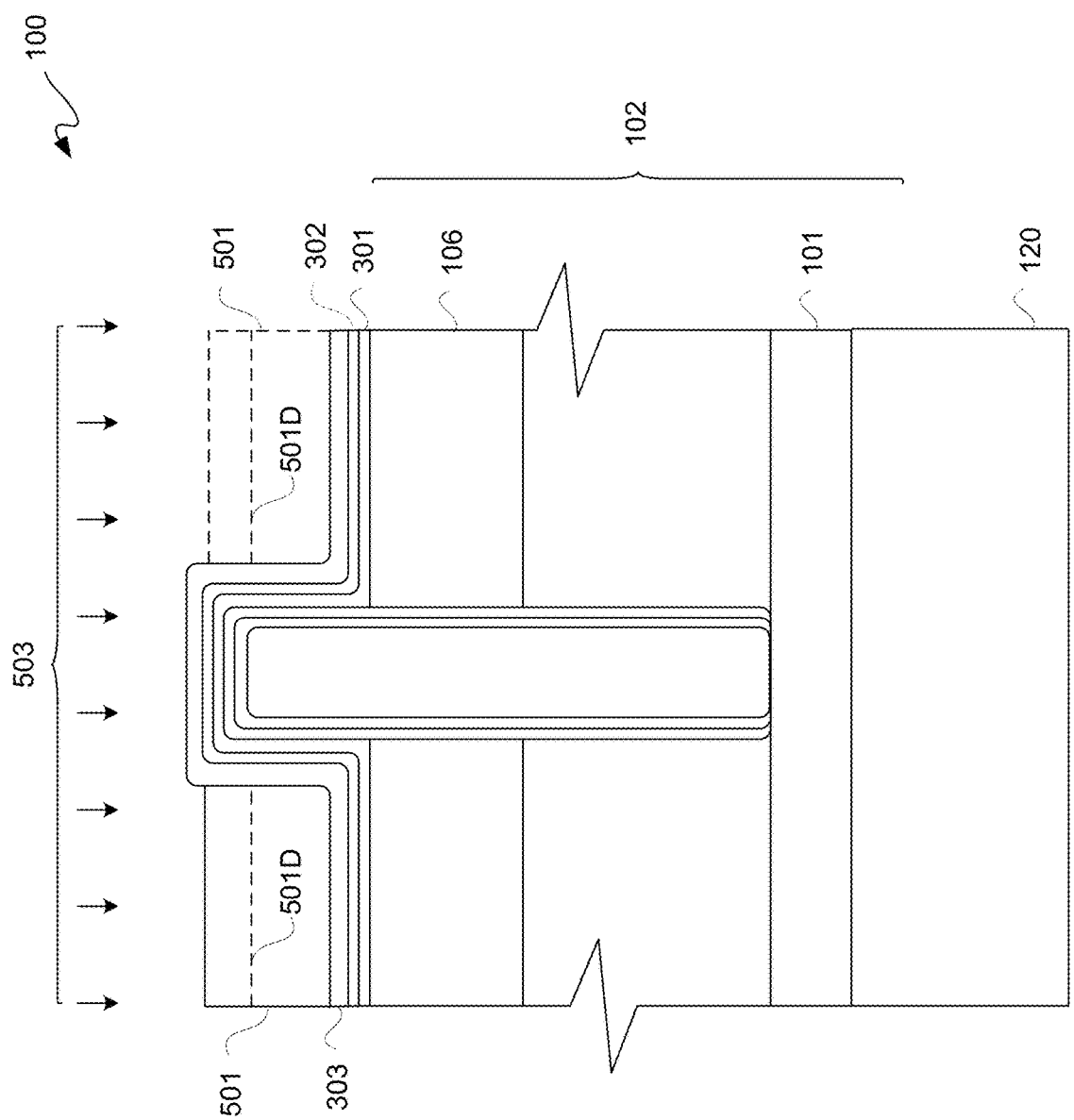
FIG. 9A is a block diagram of a cross-sectional view depicting an exemplary portion of the substrate of the in-process wafer of FIG. 3 after subsequent processing and with a taller post.

FIG. 9A is a block diagram of a cross-sectional view depicting an exemplary portion of substrate 100 of the in-process wafer of FIG. 3 after subsequent processing and with a taller post 110. In other words, FIG. 9A is the block diagram of FIG. 5A with a taller post 110. Post 110 of FIG. 9A for example may be approximately 1 to 20 microns higher than upper surface 104 with respect to top surface 107, whereas post 110 of FIG. 5A may be one or less than one micron tall measuring from top surface 107 to upper surface 104. With simultaneous reference to FIGS. 3, 4A, 4B, 5A, 5B, 8B, and 9A formation of substrate 100 is further described.

A mask formed with resist layer 501 may be formed to protect an RDL portion of metal layer 303, as previously described, from etch 503, for interconnection of metal collar 303C to such RDL with a bond structure 500. An uppermost surface of resist layer 501 may be lower in elevation than an uppermost thickness of metal layer 303. Optionally, depending on the nature of the metal of such metal layer 303, masking may be avoided at this juncture in favor of a blanket metal etch 503 to generally remove horizontal structures of metal layer 303 while leaving generally vertical structures of metal layer 303. Optionally, resist layer 501 may be disposed on another side of post 110, such as if an RDL line was bisected by post 110. If metal layer 303 and conductive member 112 are both aluminum and/or tungsten for example, then contamination from such metal is less of an issue. If, however, if either or both of metal layer 303 and conductive member 112 are copper, then silicon 106 may be protected from copper contamination by an extension of a mask provided with a resist layer 501, as generally indicated by dashed lines therefor, or optionally an etch stop layer (not shown). Accordingly, another mask may be used to pattern metal layer 303 underlying resist layer 501 for forming an RDL. Optionally, resist layer 501 or other fill material may be deposited to be co-planar with or just below, namely at least approximately level with, top surface 107 of conductive member 112, as generally indicated by dashed line 501D. Along those lines, rather than an etch 503, a CMP 503 may be used to remove material from substrate 100 down to top surface 107.

Figure 9B:
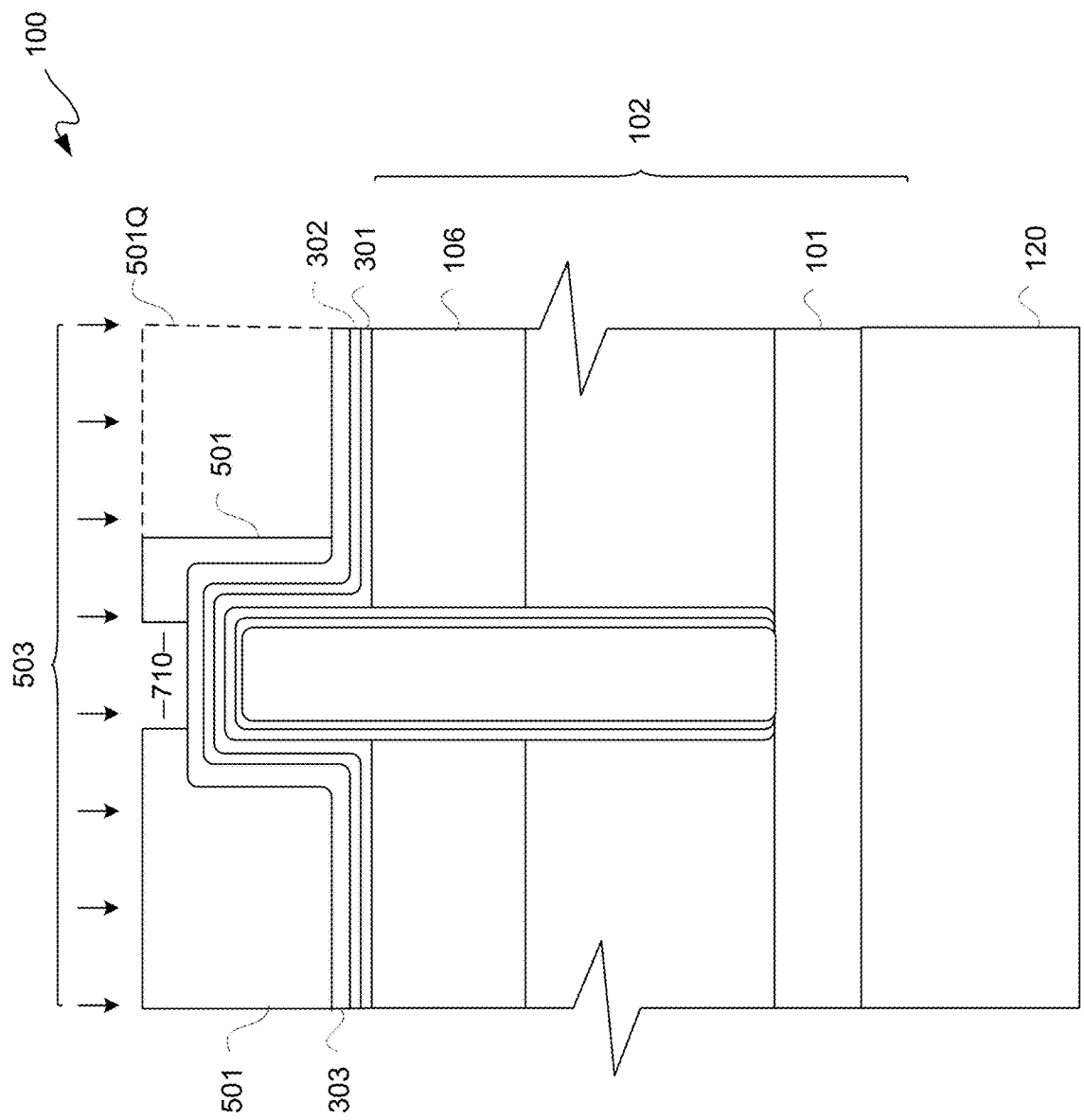
FIG. 9B is a block diagram of a cross-sectional view depicting the exemplary portion of the substrate of FIG. 3 in FIG. 9A though with a different masking layer than that in FIG. 9A.

FIG. 9B is a block diagram of a cross-sectional view depicting the exemplary portion of substrate 100 of FIG. 3 as in FIG. 9A though with a different masking layer than that shown in FIG. 9A. With simultaneous reference to FIGS. 3, 4A, 4B, 5A, 5B, 8B, 9A, and 9B formation of substrate 100 is further described.

A mask formed with resist layer 501 may be formed to protect an RDL portion of metal layer 303, as previously described, from etch 503, for interconnection of metal collar 303C to such RDL with a bond structure 500. An uppermost surface of resist layer 501 may be higher in elevation than an uppermost surface of metal layer 303 in order to perform a metal etch 503. Moreover, resist layer 501 may be disposed around post 110 to define a hole 710. Optionally, resist layer 501 may be disposed further on another side of post 110, such as if an RDL line was bisected by post 110, as generally indicated by dashed line 501Q.

Etch 503 may initially begin as a metal etch, but may be changed in situ for etching dielectric layers 302 and 301, as well as liner layer 109 and barrier/adhesion layer 111, down to top surface 107 of conductive member 112. An anisotropic dry etch may be used to form a hole, as well as correspondingly remove exposed portions of metal layer 303, dielectric layer 302, and dielectric layer 301.

Figure 10:
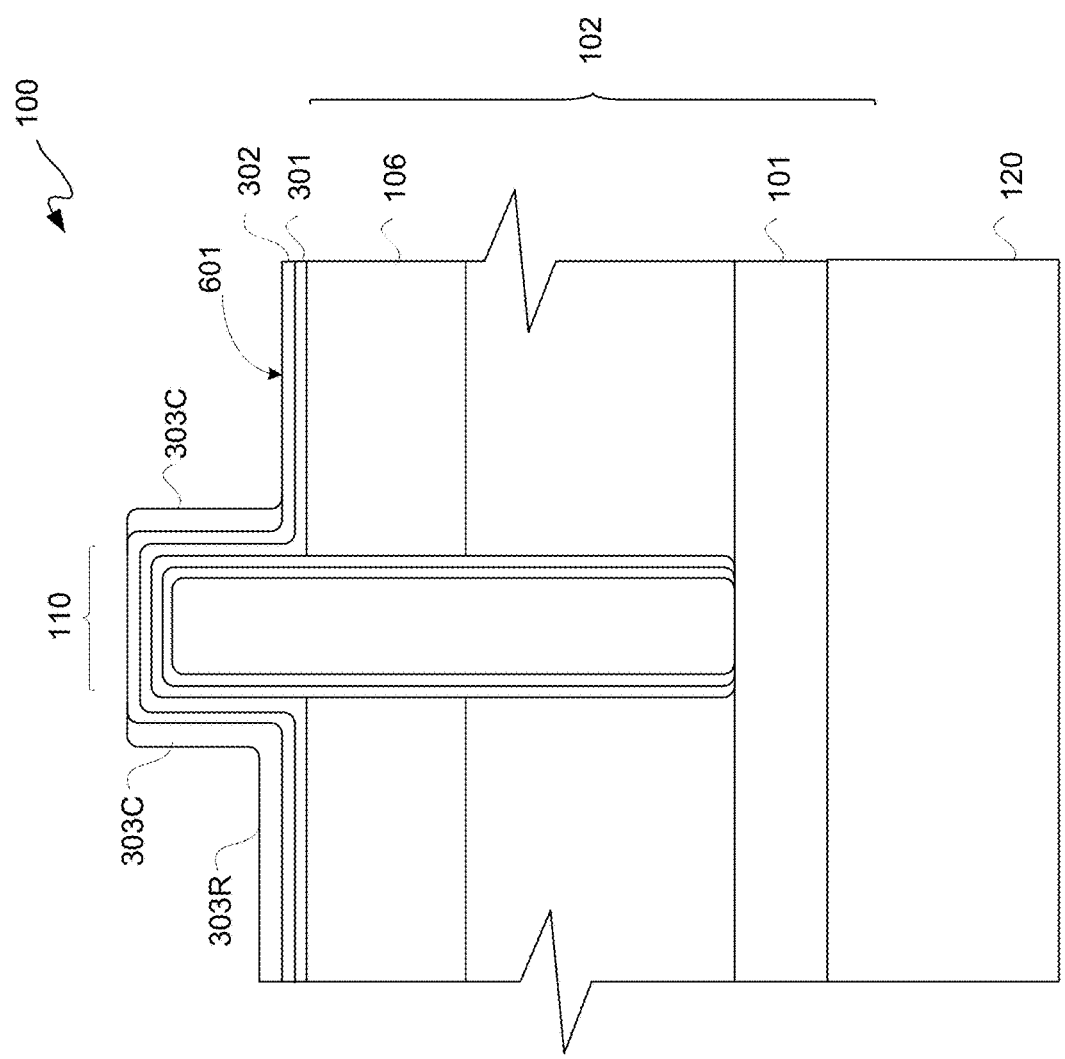
FIG. 10 is a block diagram of a cross-sectional view depicting the substrate of the in-process wafer of FIG. 9A after subsequent processing.

FIG. 10 is a block diagram of a cross-sectional view depicting the exemplary substrate 100 of the in-process wafer of FIG. 9A after subsequent processing. With simultaneous reference to FIGS. 3, 4A, 4B, 5A, 5B, 8B, 9A, and 10 formation of substrate 100 is further described. After a metal etch 503, a top surface 601 of dielectric layer 302 may be exposed, and a taller metal collar 303C, as well as corresponding taller dielectric collars 302C and 301C, from dielectric layers 302 and 301, may be disposed around post 110. A portion of metal layer 303, namely metal layer 303R, for an RDL may remain as being contiguously connected to metal collar 303C.

Figure 11:
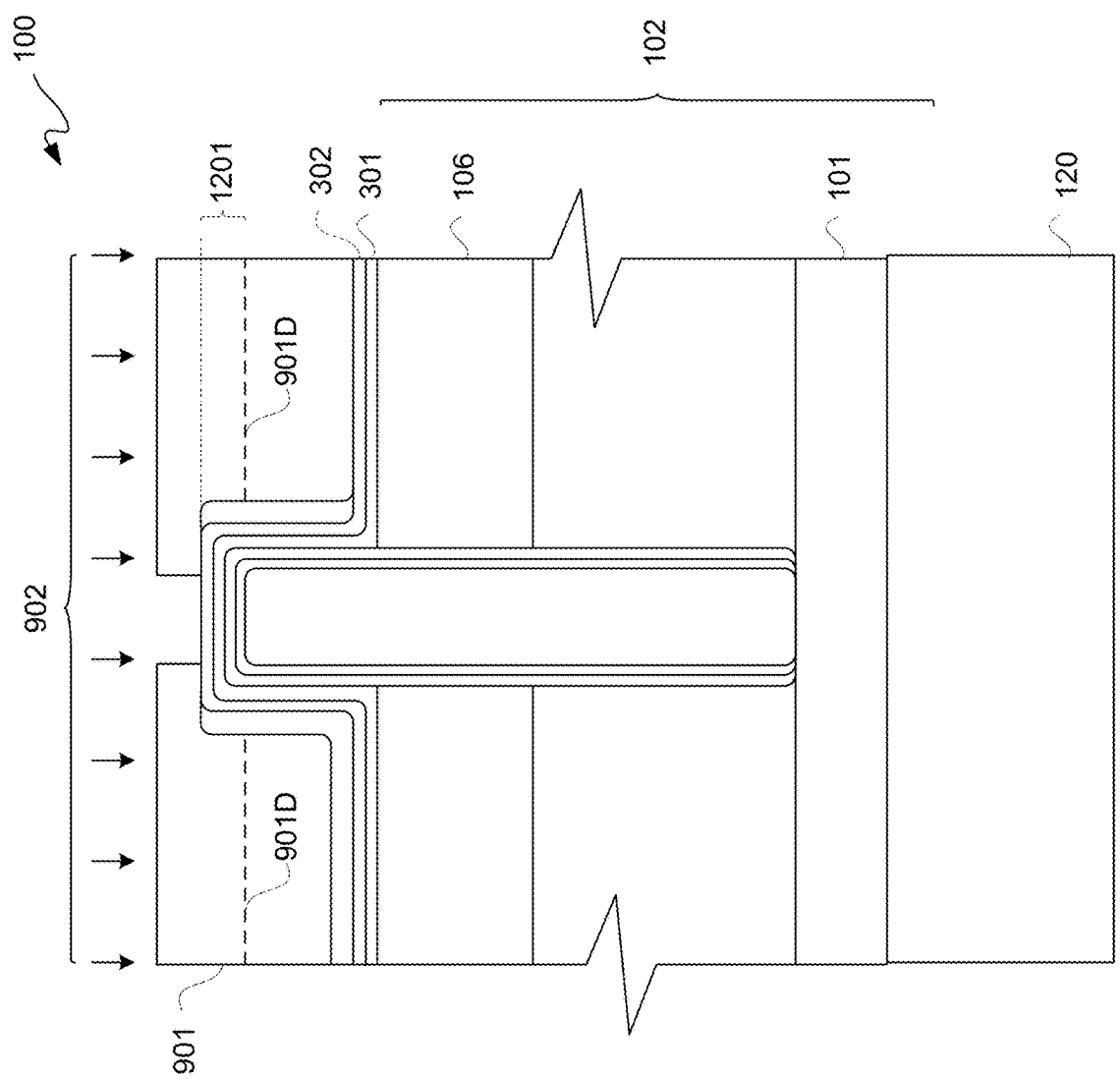
FIG. 11 is a block diagram of a cross-sectional view depicting the substrate of the in-process wafer of FIG. 10 after subsequent processing.

FIG. 11 is a block diagram of a cross-sectional view depicting substrate 100 of the in-process wafer of FIG. 10 after subsequent processing. With simultaneous reference to FIGS. 3, 4A, 4B, 5A, 5B, 8B, 9A, 10, and 11 formation of substrate 100 is further described.

A mask may be formed with a resist layer 901 to protect an RDL portion of metal layer 303R, metal collar 303C, dielectric collar 302C, and dielectric collar 301C. Optionally, resist layer 901 may be used to protect a sidewall portion of barrier/adhesion layer 111, as well as generally horizontal structures of dielectric layers 302 and 301 not disposed on top of post 110. Etch 902 may be performed by changing etches in situ to etch a hole down to a top surface 107 of conductive member 112. Recall, no CMP to expose top surface is used in this flow, as was in the flow associated with FIG. 6.

Figure 12A:
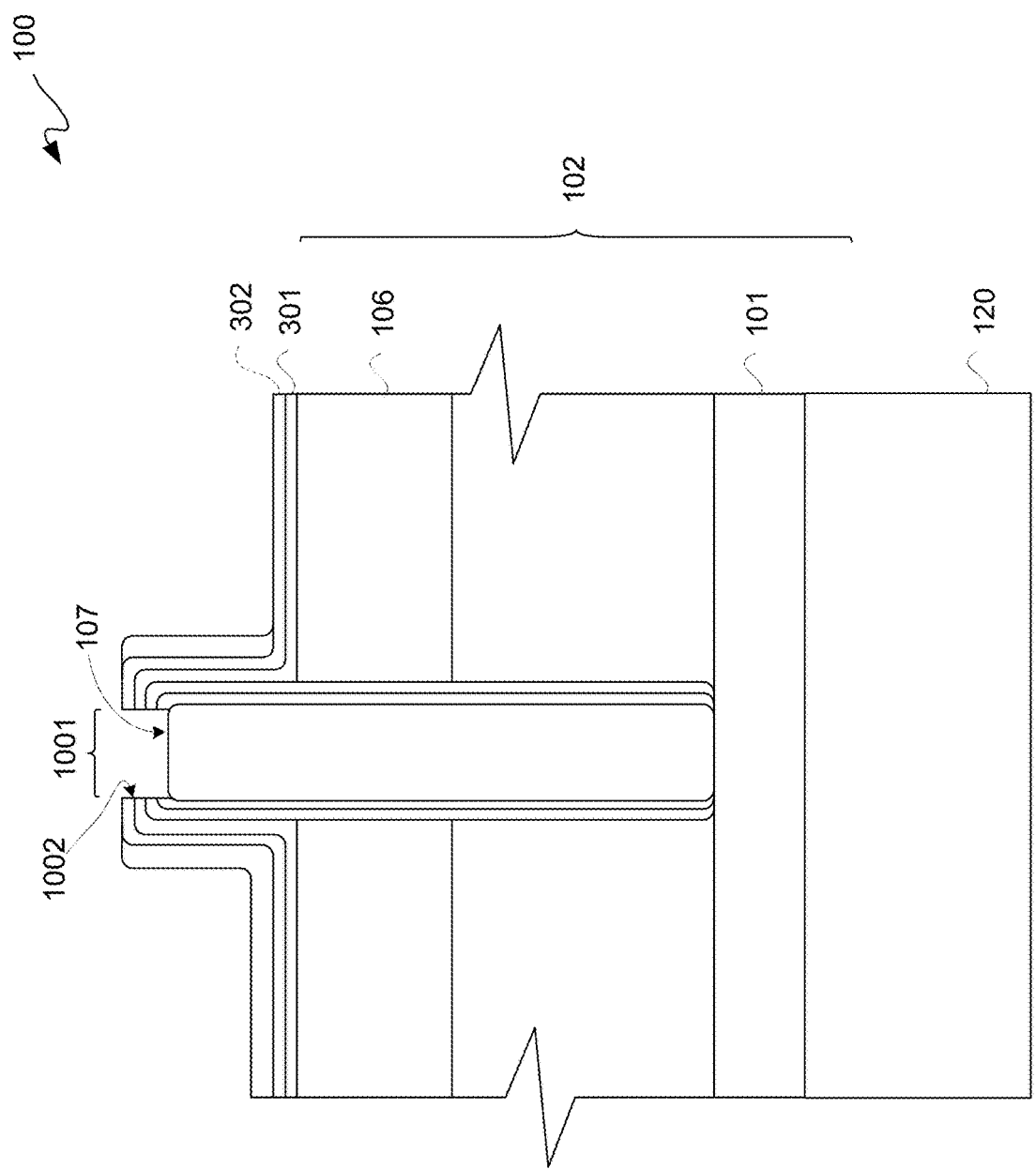
FIG. 12A is a block diagram of a cross-sectional view depicting the substrate of the in-process wafer of FIG. 11 after subsequent processing.

FIG. 12A is a block diagram of a cross-sectional view depicting substrate 100 of the in-process wafer of FIG. 11 after subsequent processing. With simultaneous reference to FIGS. 3, 4A, 4B, 5A, 5B, 8B, 9A, 10, 11, and 12A formation of substrate 100 is further described. Resist layer 901 has been removed, and a hole or opening 1001 down to a top surface 107 of conductive member 112 is formed. Opening 1001 may have a sidewall 1002 defined by layers 109, 111, 301, and 302. Optionally, resist layer 901 or other fill material may be deposited to be co-planar with or just below top surface 107 of conductive member 112, as generally indicated by dashed line 901D. Along those lines, rather than an etch 902, a CMP 902 may be used to remove material 1201 from substrate 100 down to top surface 107. Thus, material 1201 above such top surface 107 may be removed by such CMP to expose such top surface 107 for forming an electrical contact thereto. After CMP, such sacrificial resist layer 901 may be removed, and another resist mask may be formed for forming an RDL or other upper metal layer. Optionally, if there are a sufficient number and density of posts for substrate 100, a low pressure CMP may be used to remove material 1201 without using a sacrificial resist layer 901.

FIG. 12B is a block diagram of a cross-sectional view depicting substrate 100 of the in-process wafer of FIG. 9B after subsequent processing. With simultaneous reference to FIGS. 3, 4A, 4B, 5A, 5B, 8B, 9B, and 12B formation of substrate 100 is further described. Resist layer 501 has been removed, and a hole or opening 1001 down to a top surface 107 of conductive member 112 is formed responsive to etching responsive to hole 710 defined by resist layer 501. Such etching may involve a changing of etches, which changes may be done in situ. Opening 1001 may have a sidewall 1002 defined by layers 109, 111, 301, 302, and 303.

In this configuration of metal collar 303C, metal collar 303C may have a flare or flange 1003 directed outwardly, namely away from post 110, at a base or bottom portion of metal collar 303C, and dielectric collars 302C and 301C may have corresponding flares. Moreover, in this configuration of metal collar 303C, metal collar 303C may have a shoulder or flange 1004 directed inwardly, namely toward post 110, along a rim or top portion of metal collar 303C, which laterally extends inwardly toward hole 1001. Likewise, dielectric collars 302C and 301C may have corresponding shoulders. Furthermore, exposed portions of layers 303, 302, and 301 may be removed down to a top surface 104 of substrate layer 106. A polymer solder mask layer (not shown) may be subsequently deposited, which acts as a passivation layer for substrate layer 106.

For purposes of clarity and not limitation, it shall be assumed that substrate 100 of FIG. 12A is used for the following description. However, the following description equally applies to FIGS. 12A and 12B.

Figure 13A:
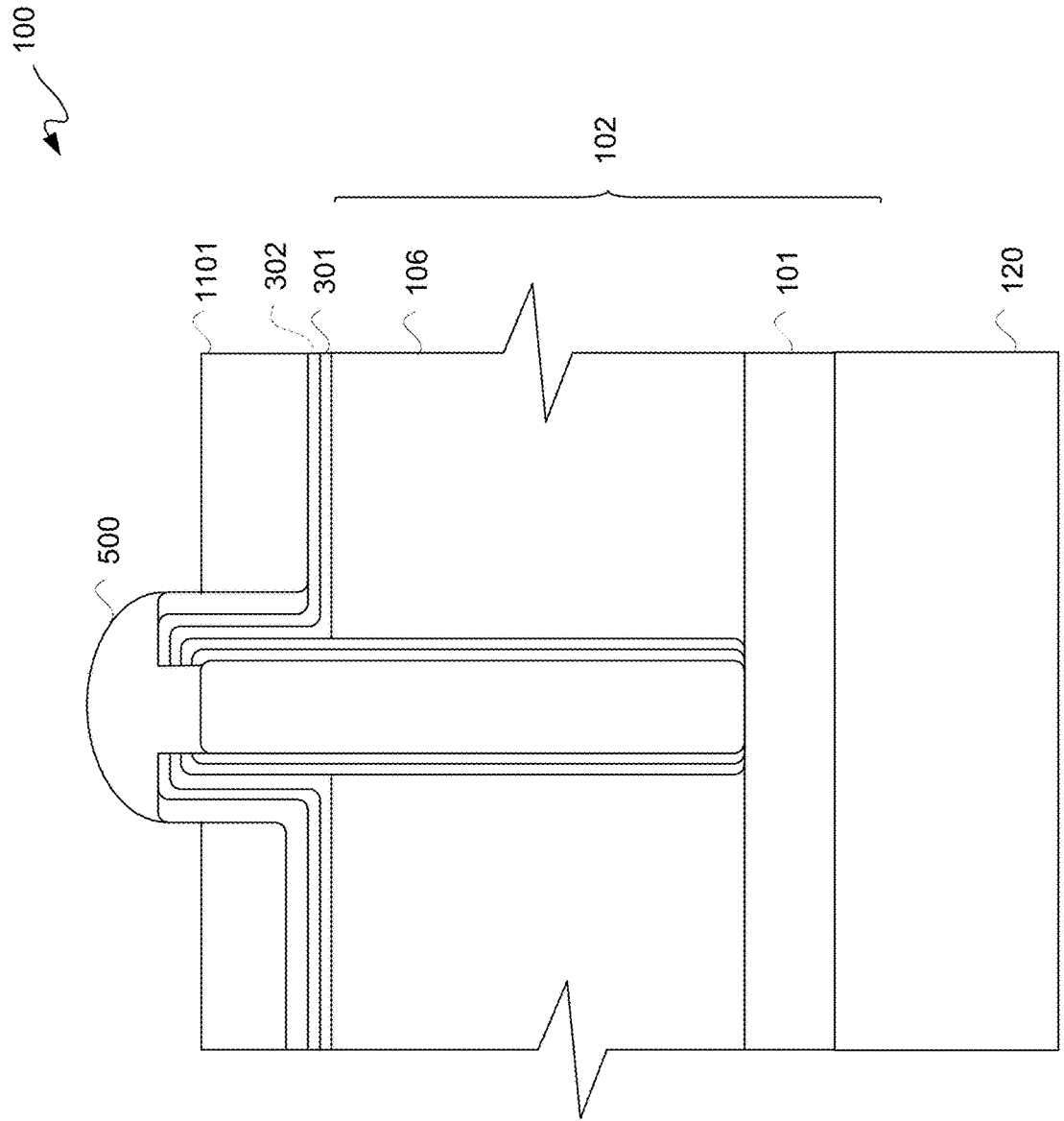
FIGS. 13A and 13B are respective block diagrams of a cross-sectional view depicting the substrate of the in-process wafer of FIG. 12A after different types of subsequent processing.

FIG. 13A is a block diagram of a cross-sectional view depicting substrate 100 of the in-process wafer of FIG. 12A after subsequent processing. More particularly, a bond structure material coating is deposited to provide bond structure 500, such as previously described. Additionally, a polyimide layer or other solder masking material may be spun on or otherwise deposited to provide a solder mask 1101. In this configuration, a dielectric layer formed of dielectric layers 301 and 302 provides at least a portion of a sidewall 1002 of opening 1001, in which opening 1001 a portion of bond structure 500 is located. However, in the configuration of FIG. 12B, a dielectric layer formed of dielectric layers 301 and 302, as well as metal layer 303, provides at least a portion of a sidewall 1002 of opening 1001, in which opening 1001 a portion of bond structure 500 is located.

Figure 13B:
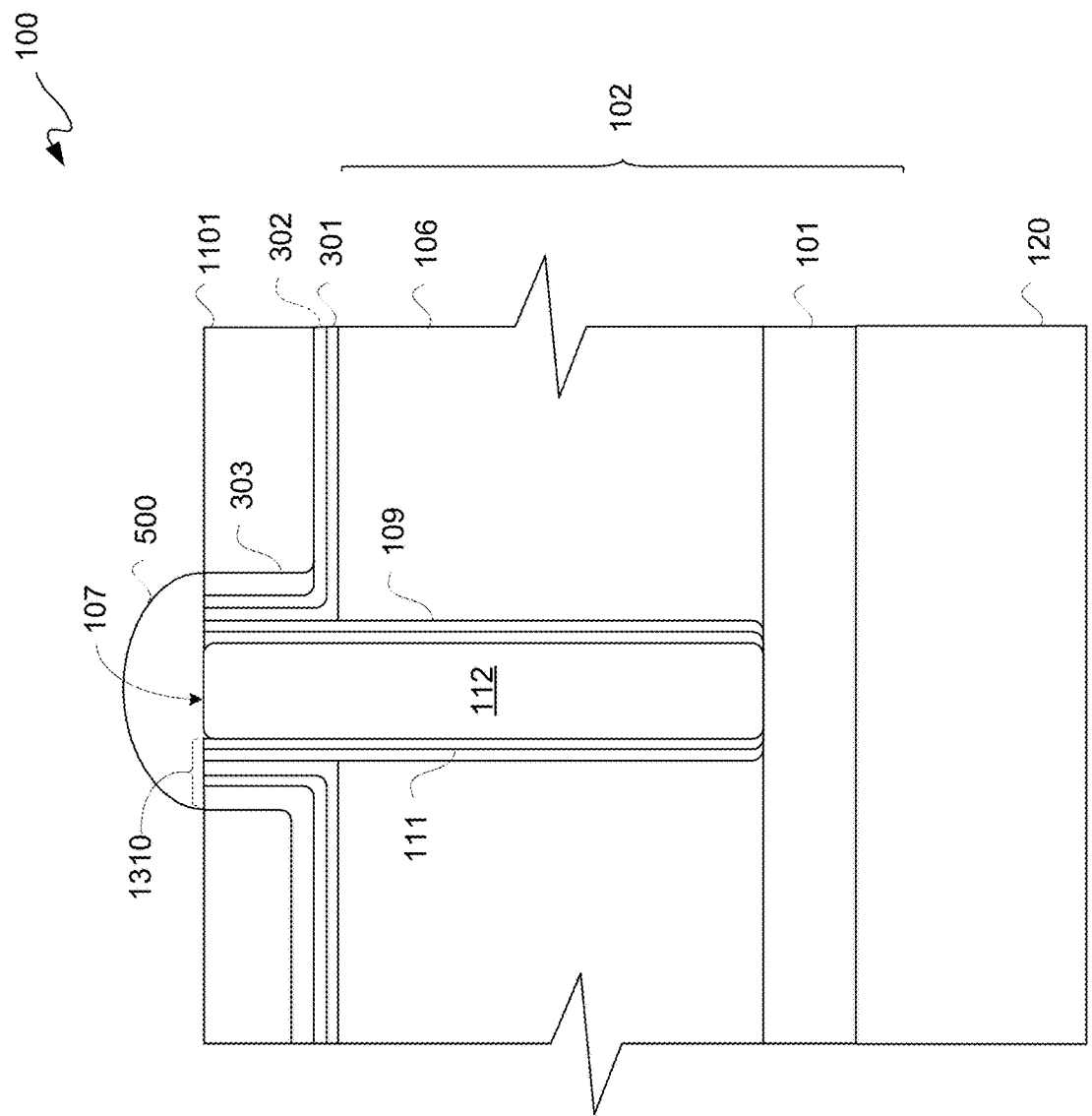

FIG. 13B is a block diagram of a cross-sectional view depicting substrate 100 of the in-process wafer of FIG. 12A after subsequent processing using CMP. More particularly, a bond structure material coating is deposited to provide bond structure 500, such as previously described, for contact with top surface 107. Additionally, a polyimide layer or other solder masking material may be spun on or otherwise deposited to provide a solder mask 1101. In this configuration, a dielectric layer formed of dielectric layers 301 and 302 does not have a sidewall 1002 or opening 1001, and so bond structure 500 is located on top surface 107, as well as top surfaces 1310 of each of dielectric layers 301 and 302, metal layer 303, liner layer 109, and adhesion/barrier layer 111.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps. Trademarks are the property of their respective owners.

What is claimed is:

1. An apparatus, comprising:
   a post having a conductor member extending from a substrate;
   an upper portion of the post extending above an upper surface of the substrate;
   a dielectric material structure in contact with an exterior surface portion of the post;
   a conductor layer in contact with a portion of the dielectric material structure;
   the conductor layer located above the substrate; and
   a surface portion of each of the dielectric material structure and the conductor layer aligned to provide a sidewall perpendicular to a plane defined by the upper surface of the substrate to define a recess for receipt of a conductive structure, the conductive structure to provide electrical continuity between the conductor layer and the conductor member within the recess.

2. The apparatus according to claim 1, wherein the conductive structure is a solder mass.

3. The apparatus according to claim 1, wherein the dielectric material structure includes a collar.

4. The apparatus according to claim 1, wherein the surface portion of the conductor member and the conductor layer are vertically offset from one another.

5. The apparatus according to claim 4, wherein the substrate is a first substrate, and wherein the conductive structure is connected to a second substrate.

6. The apparatus according to claim 5, wherein the dielectric material structure includes more than one dielectric layer.

7. The apparatus according to claim 5, wherein the conductive structure is a solder mass.

8. The apparatus according to claim 1, wherein a portion of the conductor layer is below a top surface of the conductor member.

9. The apparatus according to claim 1, wherein the conductor layer is a metallic redistribution layer.

10. The apparatus according to claim 1, wherein the post is of a through substrate layer via.

11. The apparatus according to claim 1, wherein:
    the conductive structure is a solder mass;
    the substrate is a first substrate; and
    the solder mass is connected between the first substrate and a second substrate for electrical continuity.

* * * * *